(12) United States Patent
Lee et al.

(10) Patent No.: US 12,727,443 B2
(45) Date of Patent: Sep. 1, 2026

(54) PATTERN FORMING METHOD, SEMICONDUCTOR MEMORY DEVICE, AND METHOD OF MANUFACTURING THE SAME

(71) Applicant: SAMSUNG ELECTRONICS CO., LTD., Suwon-si (KR)

(72) Inventors: Donghwan Lee, Suwon-si (KR); Kanguk Kim, Suwon-si (KR); Seokhyun Kim, Suwon-si (KR); Wonchul Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 369 days.

(21) Appl. No.: 18/500,662

(22) Filed: Nov. 2, 2023

(65) Prior Publication Data

US 2024/0266170 A1 Aug. 8, 2024

(30) Foreign Application Priority Data

Feb. 7, 2023 (KR) ........................ 10-2023-0016262

(51) Int. Cl.

| | |
|---|---|
| ***H10P 76/20*** | (2026.01) |
| ***H10B 12/00*** | (2023.01) |
| ***H10P 50/00*** | (2026.01) |

(52) U.S. Cl.

CPC ......... *H10P 76/2043* (2026.01); *H10B 12/09* (2023.02); *H10P 50/692* (2026.01); *H10P 50/695* (2026.01)

(58) Field of Classification Search

None

See application file for complete search history.

(56) References Cited

U.S. PATENT DOCUMENTS

| | | | |
|---|---|---|---|
| 8,110,506 | B2 | 2/2012 | Min et al. |
| 9,318,494 | B2 | 4/2016 | Kim et al. |
| 9,613,821 | B2 | 4/2017 | Kang et al. |
| 9,941,125 | B2 | 4/2018 | Yang et al. |
| 10,134,606 | B2 | 11/2018 | Woo et al. |
| 10,553,429 | B2 | 2/2020 | Ham et al. |

(Continued)

FOREIGN PATENT DOCUMENTS

| | | |
|---|---|---|
| CN | 112151358 | 12/2020 |
| EP | 3982396 | 4/2022 |
| KR | 10-2019-0076683 | 7/2019 |

*Primary Examiner* — Daniel Whalen

(74) *Attorney, Agent, or Firm* — Morgan, Lewis & Bockius LLP

(57) ABSTRACT

A method of forming a pattern includes forming an etch target layer over a substrate including a first area and a second area, forming a hardmask structure over the etch target layer, forming a photoresist pattern including a first photoresist pattern including an engraved pattern located in the first area and a second photoresist pattern including an embossed pattern located in the second area, forming an upper hardmask pattern including a plurality of openings, forming a reversible hardmask pattern filling the plurality of openings in the first area, and forming a feature pattern including a first pattern located in the first area and a second pattern located in the second area, wherein the first pattern includes a plurality of island patterns and a dam structure planarly surrounding the plurality of island patterns.

20 Claims, 22 Drawing Sheets

(56) References Cited

U.S. PATENT DOCUMENTS 10,573,653 B2 2/2020 Kim et al.
10,593,677 B2 3/2020 Chang et al.
11,226,552 B2 1/2022 Ahn et al.
11,270,885 B2 3/2022 Lee et al.
11,380,552 B2 7/2022 Yoon et al.
2020/0411318 A1* 12/2020 Lee ........................ H10B 12/09
2021/0082924 A1* 3/2021 Seong .................. H10B 12/315
2022/0115383 A1 4/2022 Yoon et al.
2022/0238534 A1 7/2022 Seong et al.
2022/0293420 A1 9/2022 Lee et al.

* cited by examiner

100
PA
120
DAM
X1'
X1
P
d
AR1
Y
X
Z
(b)

FIG. 4

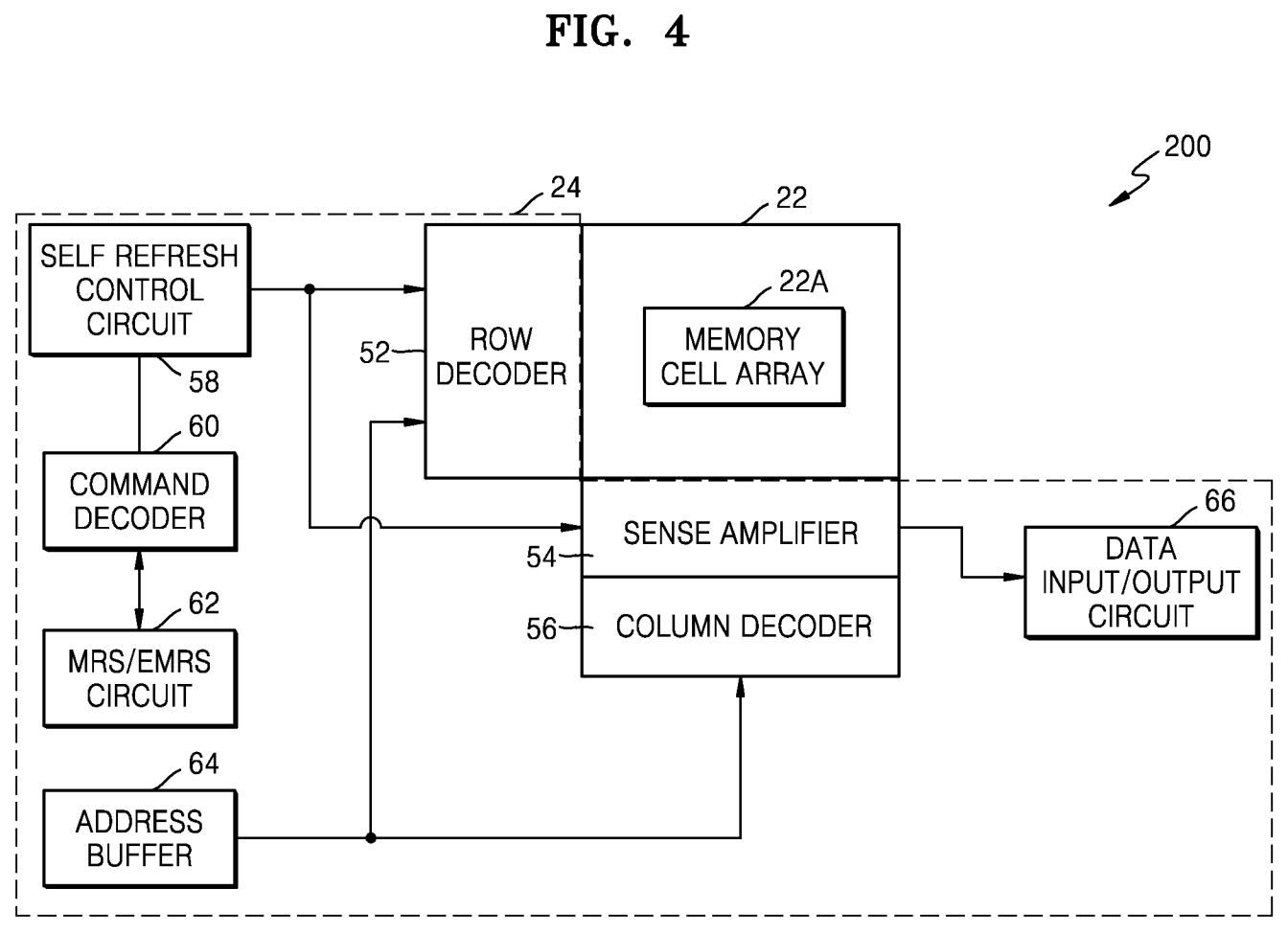

200
22
22A
MEMORY
CELL ARRAY
SENSE AMPLIFIER
COLUMN DECODER
24
ROW
DECODER
54
56
52
66
DATA
INPUT/OUTPUT
CIRCUIT
SELF REFRESH
CONTROL
CIRCUIT
58
60
COMMAND
DECODER
62
MRS/EMRS
CIRCUIT
64
ADDRESS
BUFFER

PATTERN FORMING METHOD, SEMICONDUCTOR MEMORY DEVICE, AND METHOD OF MANUFACTURING THE SAME

CROSS-REFERENCE TO RELATED APPLICATION

This application is based on and claims priority under 35 U.S.C. § 119 to Korean Patent Application No. 10-2023-0016262, filed on Feb. 7, 2023, in the Korean Intellectual Property Office, the disclosure of which is incorporated by reference herein in its entirety.

BACKGROUND

The inventive concept relates to a pattern forming method, a semiconductor memory device, and a method of manufacturing the same, and more particularly, to a method of forming a pattern in a plurality of areas with different pattern densities, a method of manufacturing a semiconductor memory device by using the pattern forming method, and a semiconductor memory device.

Recently, as the downscaling of semiconductor memory devices has rapidly progressed, the feature size of semiconductor memory devices has decreased and the line width of patterns constituting semiconductor memory devices has gradually decreased. Accordingly, the process difficulty has increased in the case of simultaneously forming patterns with various shapes, sizes, and densities required for semiconductor memory devices.

SUMMARY

The inventive concept provides a pattern forming method capable of reducing or avoiding an increase in process difficulty and maximizing the process margin in the case of simultaneously forming patterns having various shapes, sizes, and densities in a plurality of areas, and a method of manufacturing a semiconductor memory device by using the pattern forming method.

The inventive concept also provides a semiconductor memory device obtained from the above methods.

According to an aspect of the inventive concept, there is provided a method of forming a pattern, the method including forming an etch target layer over a substrate including a first area and a second area, forming a hardmask structure including a plurality of hardmask layers, over the etch target layer in the first area and the second area, forming a photoresist layer over the hardmask structure in the first area and the second area, forming a first photoresist pattern including an engraved pattern in the first area and a second photoresist pattern including an embossed pattern in the second area from the photoresist layer, forming, in the first area and the second area, an upper hardmask pattern including a plurality of openings by transferring a shape of the photoresist pattern to an upper hardmask layer, forming a reversible hardmask pattern filling the plurality of openings in the first area, and forming a feature pattern including a first pattern located in the first area and a second pattern located in the second area, by transferring a shape of the reversible hardmask pattern to the etch target layer in the first area and transferring a shape of the upper hardmask pattern to the etch target layer in the second area, wherein the first pattern includes a plurality of island patterns and a dam structure surrounding the plurality of island patterns.

According to another aspect of the inventive concept, there is provided a method of forming a pattern, the method including forming an etch target layer over a substrate including a first area and a second area, forming a hardmask structure including a plurality of hardmask layers, over the etch target layer, forming a first photoresist pattern that is an engraved pattern having a planar shape reverse to a planar shape of a first pattern to be formed in the first area, over the hardmask structure in the first area and forming a second photoresist pattern that is an embossed pattern having a planar shape the same as a planar shape of a second pattern to be formed in the second area, over the hardmask structure in the second area, and forming the first pattern and the second pattern from the etch target layer by etching the hardmask structure and the etch target layer using the first photoresist pattern and the second photoresist pattern, wherein the first pattern includes a plurality of island patterns and a dam structure planarly surrounding the plurality of island patterns.

According to another aspect of the inventive concept, there is provided a method of manufacturing a semiconductor memory device, the method including form an etch target layer over a substrate including a memory cell array and a peripheral circuit area, forming a hardmask structure including a plurality of hardmask layers over the etch target layer, forming a photoresist layer over the hardmask structure, forming a first photoresist pattern including an engraved pattern in the memory cell array, and in which a plurality of holes spaced apart from each other are formed, and a second photoresist pattern including an embossed pattern in the peripheral circuit area and has a shape of a plurality of lines, forming an upper hardmask pattern including a plurality of openings in the memory cell array and the peripheral circuit area, forming a reversible hardmask pattern filling the plurality of openings only in the memory cell array among the memory cell array and the peripheral circuit area, and forming a plurality of island patterns and a dam structure from the etch target layer in the memory cell array by transferring a shape of the reversible hardmask pattern to the etch target layer and forming a plurality of line patterns from the etch target layer in the peripheral circuit area by transferring a shape of the upper hardmask pattern to the etch target layer.

BRIEF DESCRIPTION OF THE DRAWINGS

Embodiments will be more clearly understood from the following detailed description taken in conjunction with the accompanying drawings in which:

FIG. 4 is a block diagram illustrating a configuration of a semiconductor memory device according to an embodiment;

DETAILED DESCRIPTION OF THE EMBODIMENTS

Figure 1:
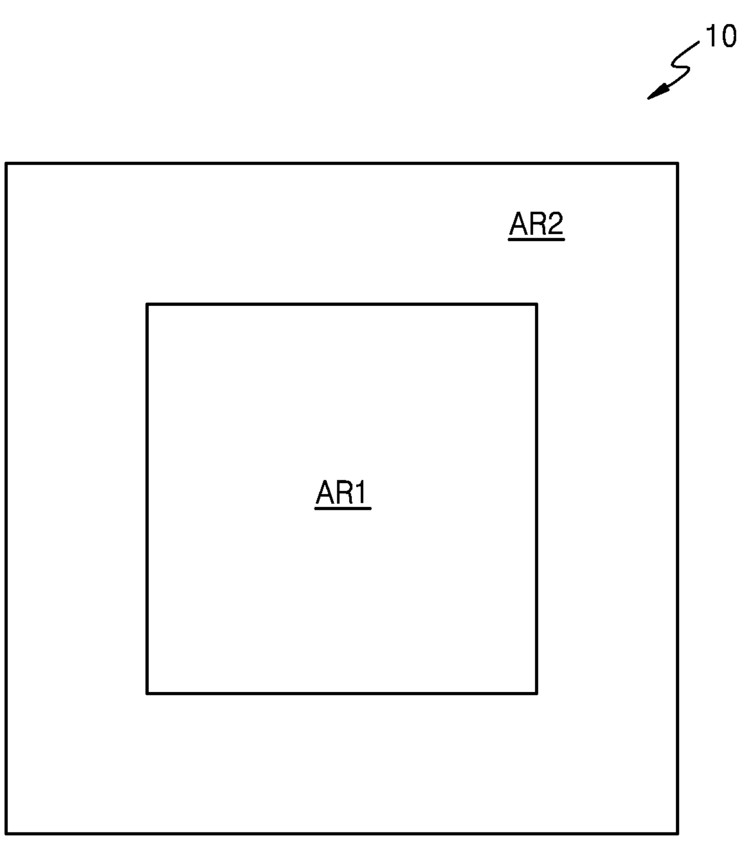
FIG. 1 is a plan view schematically illustrating some elements of a semiconductor memory device according to an embodiment.

Hereinafter, embodiments of the inventive concept will be described in detail with reference to the accompanying drawings. Herein, like reference numerals will denote like elements, and redundant descriptions thereof may be omitted for conciseness.

FIG. 1 is a plan view schematically illustrating some elements of a semiconductor memory device according to an embodiment.

Referring to FIG. 1, a semiconductor memory device 100 may include a first area AR1 and a second area AR2 having different pattern densities and different pattern shapes. The first area AR1 may be a high-density area having a relatively high pattern density and the second area AR2 may be a low-density area having a relatively low pattern density. The first area AR1 may be a memory cell array of a semiconductor memory device. For example, a volatile memory cell array such as a dynamic random access memory (DRAM), or a nonvolatile memory cell array such as a flash memory may be formed in the first area AR1. The second area AR2 may be an edge area of the memory cell array, or a core area in which peripheral circuits electrically connected to cell arrays in the first area AR1, are formed. The first area AR1 may be surrounded by the second area AR2. The term "peripheral circuit area" used herein may include a core area and an area in which the peripheral circuits described above are formed.

The peripheral circuit area may be referred to as, for example, a peripheral circuit area and/or a core circuit area, and may be an area in which circuits are arranged around the memory cell array. The circuits in the peripheral circuit area may be used to drive the semiconductor memory device 100, or read/write a plurality of memory cells of the semiconductor memory device 100. In some embodiments, decoders, sense amplifiers, input/output buffers, and/or the like may be arranged in the peripheral circuit area.

In the first area AR1, a plurality of patterns having a relatively small width may be spaced apart from each other to form a regular arrangement and may be repeatedly formed at a relatively small pitch. In the second area AR2, a plurality of patterns having a nonuniform (varying) width and length may be arranged to be spaced apart from each other with a space of a nonuniform size therebetween and may be repeatedly formed at a nonuniform pitch. The pattern density in the first area AR1 may be greater than the pattern density in the second area AR2.

Figure 2A:
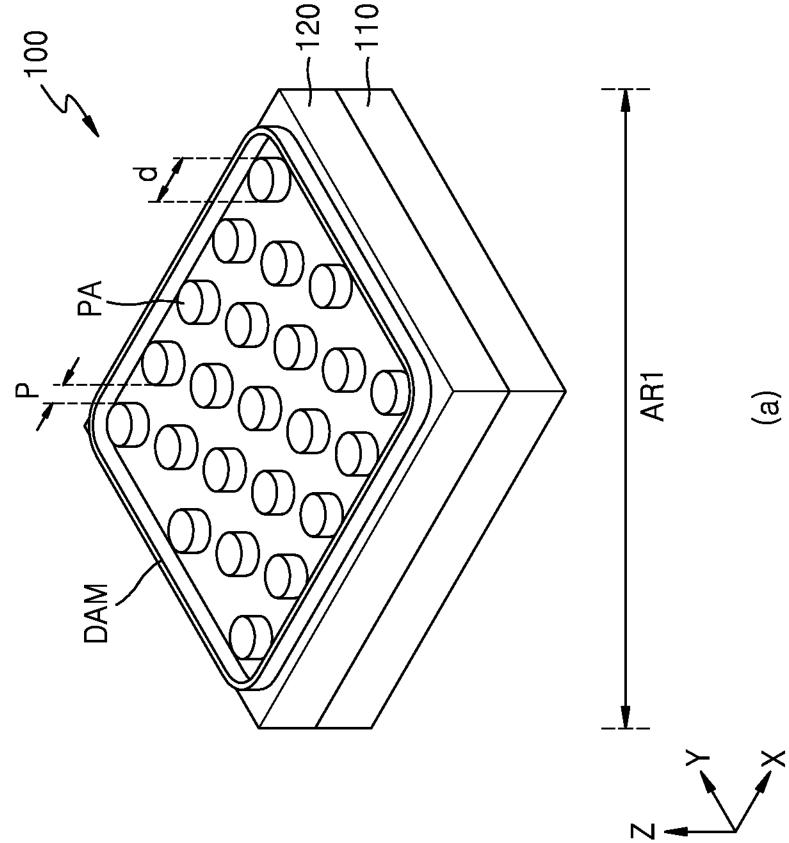
FIG. 2A(a) and FIG. 2A(b) are respectively a perspective view and a plan view of a plurality of island patterns and a dam structure that may be implemented in a first area of a semiconductor memory device according to an embodiment.
Figure 2B:
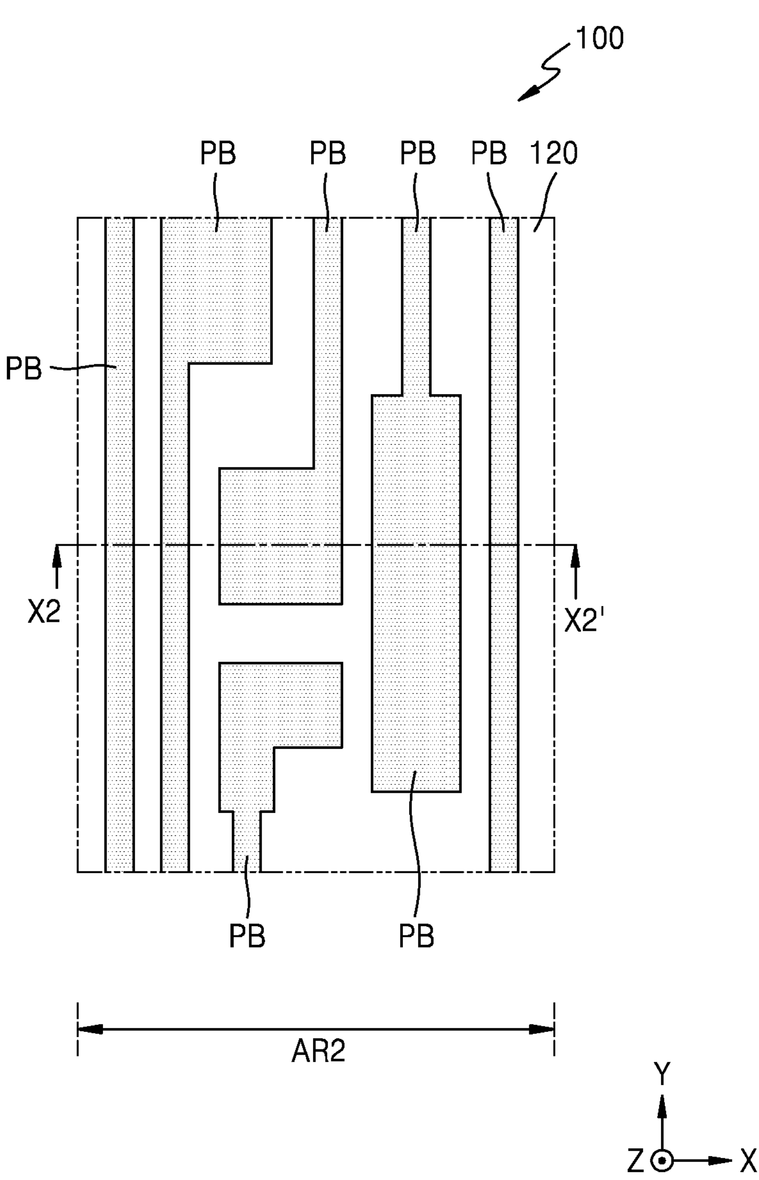
FIG. 2B is a planar layout diagram illustrating a plurality of line patterns that may be implemented in a second area of a semiconductor memory device according to an embodiment.

FIG. 2A illustrates a plurality of island patterns and a dam structure that may be implemented in a first area AR1 of a semiconductor memory device according to an embodiment, wherein FIG. 2A (a) is a perspective view illustrating a portion of the first area AR1 and FIG. 2A (b) is a plan view illustrating a planar arrangement of the plurality of island patterns and the dam structure illustrated in FIG. 2A (a). FIG. 2B is a planar layout diagram illustrating a plurality of line patterns that may be implemented in a second area AR2 of a semiconductor memory device according to an embodiment. A plurality of patterns that have a relatively small width may be spaced apart from each other to form a regular arrangement.

Referring to FIGS. 2A and 2B, the semiconductor memory device 100 may include a substrate 110 and a lower structure 120 formed over the substrate 110.

In various embodiments, the substrate 110 may include semiconductor elements, such as Si and Ge or compound semiconductors, such as SiC, GaAs, InAs, and InP. The lower structure 120 may include an insulating layer, a conductive layer, or a combination thereof. For example, the lower structure 120 may include structures including at least one conductive area, where the conductive area may include a doped structure, a doped semiconductor layer, a metal layer, or combinations thereof. The lower structure 120 may include conductive areas such as a line layer, contact plugs, and/or transistors, and insulating layers for insulating them from each other.

As illustrated in FIG. 2A, the semiconductor memory device 100 may include a plurality of island patterns PA that are repeatedly arranged over the lower structure 120 in the first area AR1 with a pitch P therebetween in the horizontal direction (X direction and/or Y direction), for example, in the first horizontal direction (X direction). The island patterns PA may be repeatedly arranged in a regular grid pattern or array. Each of the plurality of island patterns PA may have a cylindrical cross-sectional shape. The pitch P between adjacent island patterns PA may be about 25 nm or less. Also, a diameter "d" of each of the plurality of island patterns PA may be about 25 nm or less. The plurality of island patterns PA may be a plurality of landing pads LP (see FIG. 6A). The plurality of island patterns PA can each have an upper surface with a circular disc shape and may be formed in a honeycomb shape arranged in zigzag in a horizontal direction. The island patterns PA can protrude above the surface of the lower structure 120, where the island patterns PA can protrude above the surface of the lower structure 120 by a predetermined height.

Also, in the plan view, the semiconductor memory device 100 may include a dam structure DAM surrounding the plurality of island patterns PA over the lower structure 120 in the first area AR1. The dam structure DAM may reduce the process difficulty due to the pattern density difference between the first area AR1 and the second area AR2 and secure the structural reliability of the semiconductor memory device 100. As described below, the dam structure DAM may be formed in the same process as the plurality of island patterns PA. The dam structure DAM may protrude above the surface of the lower structure 120, where the dam structure DAM can protrude above the surface of the lower structure 120 by a predetermined height.

The upper surface of the plurality of island patterns PA and the upper surface of the dam structure DAM may be at the same level (height) in the vertical direction (Z direction). The upper surface of a plurality of line patterns PB may be at a lower level (height) in the vertical direction (Z direction) than the upper surface of the plurality of island patterns PA or the upper surface of the dam structure DAM.

The dam structure DAM may extend in the first horizontal direction (X direction) or the second horizontal direction (Y direction). The dam structure DAM may be arranged along the periphery of the first area AR1, where the dam structure DAM may encircle at least a portion of the first area AR1. The dam structure DAM may have a tetragonal ring shape formed by a wall having a rectangular cross-section extending along the rectangular sides of the first area AR1 on the X-Y plane. The corners of the dam structure DAM may be rounded, where the wall of the dam structure DAM may have a predetermined radius of curvature in the X-Y plane. The dam structure DAM may extend in the first horizontal direction (X direction) or the second horizontal direction (Y direction). The extension length of the dam structure DAM in the first horizontal direction (X direction) or the second horizontal direction (Y direction) may have a value similar to or somewhat less than the length of the rectangular side of the first area AR1.

The dam structure DAM may include a portion extending in the first horizontal direction (X direction) and a portion extending in the second horizontal direction (Y direction), and the dam structure DAM may be arranged to surround the first area AR1. The dam structure DAM may extend along the edge of the first area AR1. On the X-Y plane, the dam structure DAM may have a substantially tetragonal ring shape, where the vertexes of the dam structure DAM may be rounded, where on the X-Y plane, the vertex of the dam structure DAM may have a curvature. On the X-Y plane, the curvature of the vertex of the dam structure DAM may be greater than 0.

As the vertex of the dam structure DAM is rounded, the distance between the dam structure DAM and the plurality of line patterns PB closest to the dam structure DAM among the plurality of line patterns PB may increase. For example, the distance between the dam structure DAM and the plurality of line patterns PB may be about 100 nanometers (nm) to about 300 nm.

Among the plurality of island patterns PA, an island pattern PA adjacent to the dam structure DAM may be a dummy island pattern. In the plan view, the dam structure DAM may surround the dummy island pattern and the island pattern PA. In the plan view, the dummy island pattern may surround the plurality of island patterns PA.

The plurality of island patterns PA and/or the dam structure DAM may include an insulating pattern, a conductive pattern, or a combination thereof. In embodiments, the plurality of island patterns PA and/or the dam structure DAM may include a doped semiconductor, a metal, a conductive metal nitride, or combinations thereof. The plurality of island patterns PA and/or the dam structure DAM may have a single-layer structure or a multi-layer structure.

Herein, the direction parallel to the main surface of the substrate 110 may be referred to as the horizontal direction (X direction and/or Y direction), and the direction perpendicular to the horizontal direction (X direction and/or Y direction) may be referred to as the vertical direction (Z direction).

FIG. 2A illustrates that the plurality of island patterns PA are spaced apart from each other and regularly arranged to form a honeycomb structure arranged in zigzag in the horizontal direction (X direction and/or Y direction) in the plan view; however, the inventive concept is not limited thereto. For example, the plurality of island patterns PA may be arranged in a matrix structure in the plan view. The island patterns PA may have a circular disc shape.

As illustrated in FIG. 2B, the semiconductor memory device 100 may include a plurality of line patterns PB spaced apart from each other and extending in the horizontal direction over the lower structure 120 in the second area AR2. At least some of the plurality of line patterns PB may extend parallel to each other. At least some of the plurality of line patterns PB may be connected to other conductive areas through a contact.

The plurality of line patterns PB may be spaced apart from each other with an inter-line space of various sizes therebetween in the horizontal direction, for example, the first horizontal direction (X direction) or the second horizontal direction (Y direction). The minimum distance between two adjacent line patterns PB in a portion of the second area AR2 may be the minimum feature size of the semiconductor memory device 100. The minimum distance between two adjacent line patterns PB in another portion of the second area AR2 may be several times to several tens of times the minimum feature size of the semiconductor memory device 100.

The width of each of the plurality of line patterns PB in the horizontal direction, for example, the width in the first horizontal direction (X direction) and the width in the second horizontal direction (Y direction), and the distance between each of the plurality of line patterns PB in the horizontal direction, for example, the distance therebetween in the first horizontal direction (X direction) and the distance therebetween in the second horizontal direction (Y direction), may vary. The minimum horizontal distance between two adjacent line patterns PB may be at least the minimum feature size of the semiconductor memory device 100. For example, the second area AR2 may include an area in which the minimum horizontal distance between two adjacent line patterns PB is about 20 nm or less, and may also include an area in which the minimum horizontal distance therebetween is about 20 nm or more, for example, about 40 nm or more. Also, the plurality of line patterns PB may include a portion having a width-direction (i.e., the first horizontal direction (X direction)) size of about 20 nm or less and may also include a portion having a width-direction size of about 20 nm or more, for example, about 40 nm or more.

The plurality of line patterns PB may include an insulating pattern, a conductive pattern, or a combination thereof. The plurality of line patterns PB may have a single-layer structure or a multi-layer structure. The plurality of line patterns PB may be a plurality of gate line patterns GLP (see FIG. 6A). The plurality of island patterns PA and the plurality of line patterns PB may include the same material in the first area AR1 and the second area AR2.

In embodiments, the plurality of line patterns PB may include a doped semiconductor, a metal, a conductive metal nitride, or combinations thereof.

The plurality of island patterns PA, the plurality of line patterns PB, and the dam structure DAM may be formed through, for example, an extreme ultraviolet lithography (EUV) process.

In various embodiments, a plurality of island patterns, a plurality of line patterns, and a dam structure can be formed by an embossed patterning method through an EUV lithography process. Because the plurality of island patterns, the plurality of line patterns, and the dam structure are different from each other in shape, but can be formed by the same embossed patterning method, the resolution of the plurality of island patterns may be relatively low.

In various embodiments, the semiconductor memory device 100 of the inventive concept may include the plurality of island patterns PA and the dam structure DAM formed by an engraved patterning method to form an engraved pattern, and the plurality of line patterns PB formed by an embossed patterning method. Thus, the resolution of the plurality of island patterns PA may be relatively high. Also, because the dam structure DAM is formed by an engraved patterning method, the vertex of the dam structure DAM may be rounded. Thus, because the distance between the dam structure DAM and the plurality of island patterns PA increases, a process margin for forming the plurality of island patterns PA may be secured.

FIGS. 3A to 3M are sequential cross-sectional views illustrating a pattern forming method according to an embodiment. A method of forming the plurality of island patterns PA and the plurality of line patterns PB included in the semiconductor memory device 100 illustrated in FIGS. 2A and 2B is described with reference to FIGS. 3A to 3M. FIGS. 3A to 3M illustrate sequential cross-sectional configurations of areas corresponding to a cross-section taken along line X1-X1' of FIG. 2A (b) and a cross-section taken along line X2-X2' of FIG. 2B.

Figure 3A:
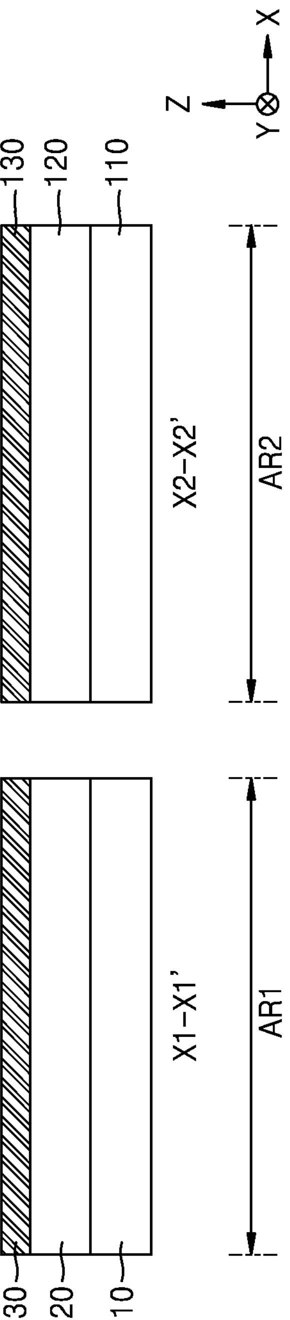
FIGS. 3A to 3M are sequential cross-sectional views illustrating a pattern forming method according to an embodiment.

Referring to FIG. 3A, a lower structure 120 may be formed over a substrate 110. The levels of the upper surface of the lower structure 120 in the first area AR1 and the second area AR2 may be substantially equal or similar to each other, where the thickness of the lower structure 120 can be uniform in the first area AR1 and the second area AR2. Here, the term "level" may refer to the vertical height from the upper surface of the substrate 110.

In various embodiments, a semiconductor memory device may be manufactured using an etch target layer 130 over the substrate 110 and the lower structure 120, including a memory cell array and a peripheral circuit area. An etch target layer 130 may be formed on the lower structure 120. The etch target layer 130 may include the same material as the plurality of island patterns PA and the plurality of line patterns PB.

Figure 3B:
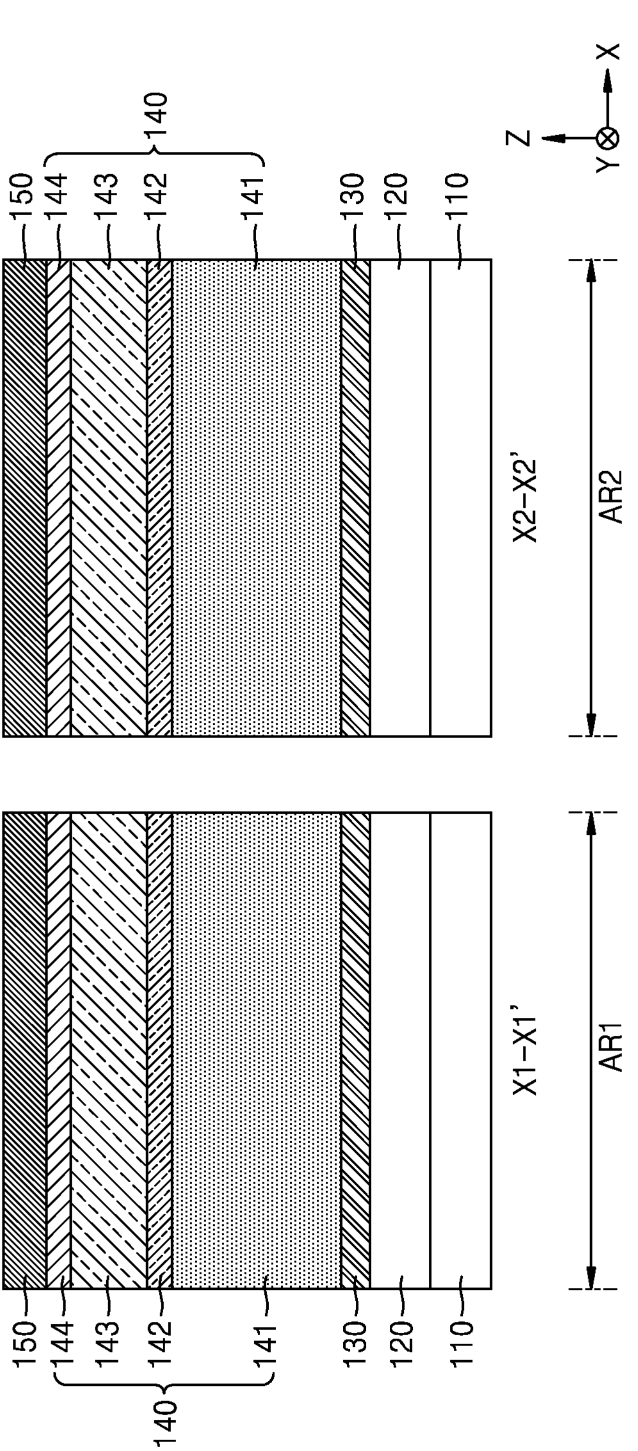

Referring to FIG. 3B, a hardmask structure 140 including a plurality of hardmask layers may be formed on the etch target layer 130, and a photoresist layer 150 may be formed over the hardmask structure 140.

In various embodiments, the hardmask structure 140 may include a plurality of hardmask layers, that may include a lower hardmask layer 141, a main hardmask layer 142, an upper hardmask layer 143, and a first anti-reflection layer 144 sequentially stacked over the etch target layer 130. The lower hardmask layer 141, the main hardmask layer 142, the upper hardmask layer 143, and the first anti-reflection layer 144 may include different materials having different etch selectivities with respect to other adjacent layers thereunder or thereover.

In various embodiments, the lower hardmask layer 141 may include an amorphous carbon layer (ACL), a silicon oxide layer, or a silicon nitride layer. The lower hardmask layer 141 may have a thickness of about 1,000 Å to about 2,000 Å. In embodiments, the main hardmask layer 142 may include polysilicon. The main hardmask layer 142 may have a thickness of about 100 Å to about 400 Å. In embodiments, the upper hardmask layer 143 may include a spin-on-hardmask (SOH) layer that is a layer including a hydrocarbon compound or a derivative thereof having a relatively high carbon content of about 85 wt % to about 99 wt %. The upper hardmask layer 143 may have a thickness of about 300 Å (Angstroms) to about 1,000 Å. The first anti-reflection layer 144 may include silicon nitride, silicon oxynitride, amorphous silicon, titanium, titanium dioxide, titanium nitride, chromium oxide, carbon, an organic anti-reflective coating (ARC) material, or combinations thereof. The first anti-reflection layer 144 may have a thickness of about 200 Å to about 400 Å.

The photoresist layer 150 may include a resist for extreme ultraviolet (EUV) (13.5 nm), a resist for KrF excimer laser (248 nm), a resist for ArF excimer laser (193 nm), or a resist for F2 excimer laser (157 nm).

Figure 3C:
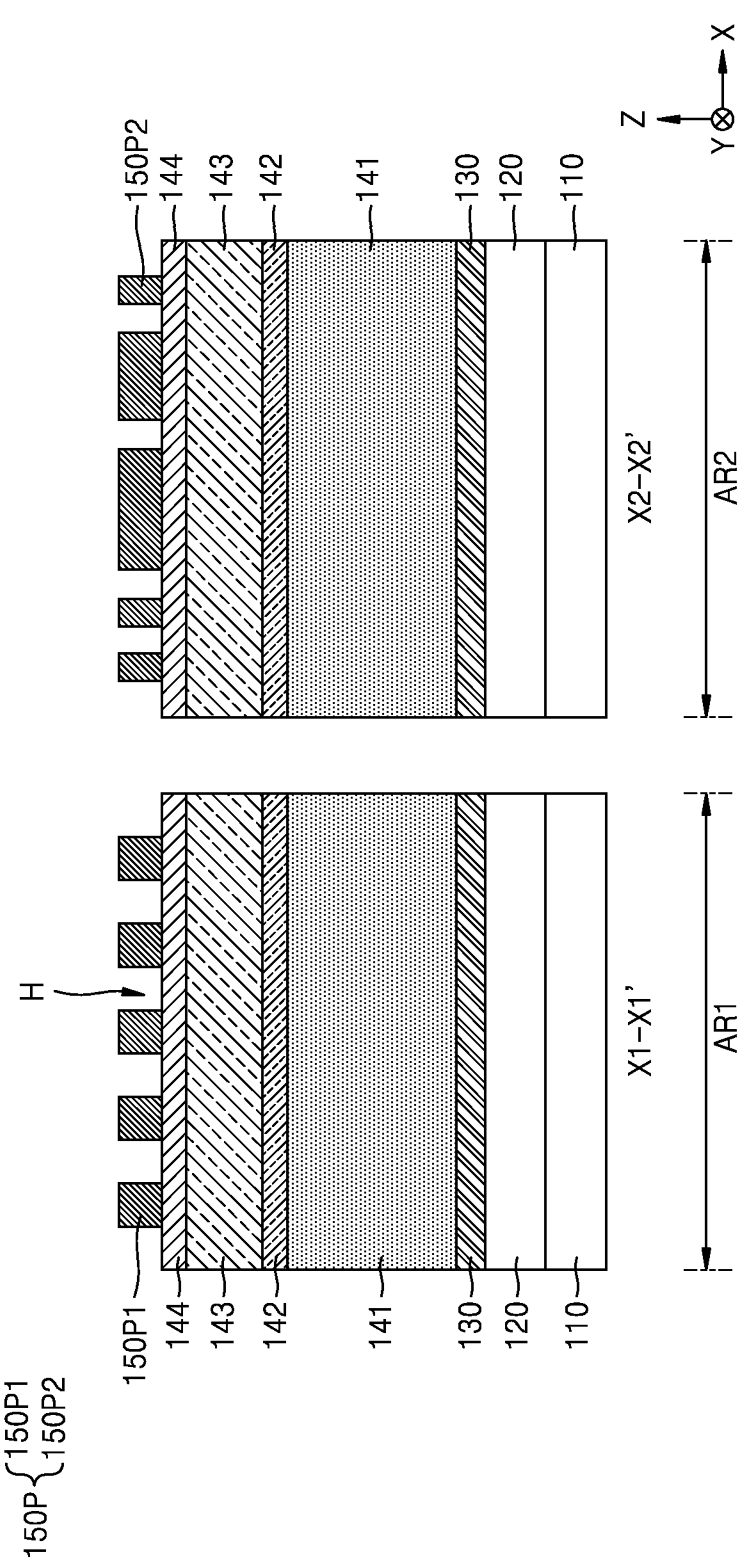

Referring to FIG. 3C, a photoresist pattern 150P may be formed from the photoresist layer 150 by simultaneously exposing and developing the photoresist layer 150 in the first area AR1 and the second area AR2.

In various embodiments, a semiconductor memory device may be manufactured by exposing and developing the photoresist layer 150 on the hardmask structure 140 to form a photoresist pattern 150P in the memory cell array and the peripheral circuit area. The photoresist pattern 150P may include a first photoresist pattern 150P1 located in the first area AR1 and a second photoresist pattern 150P2 located in the second area AR2. The first photoresist pattern 150P1 may be an engraved pattern having a planar shape that is reverse to (a negative of) the planar shape of each of a plurality of island patterns PA (see FIG. 2A) and a dam structure DAM (see FIG. 2A) to be formed in the first area AR1. The planar shape of a plurality of holes H formed in the first photoresist pattern 150P1 may be the same as the planar shape of the plurality of island patterns PA and/or the dam structure DAM illustrated in FIG. 2A.

The second photoresist pattern 150P2 may be an embossed pattern having the same planar shape as a plurality of line patterns PB (see FIG. 2B) to be formed in the second area AR2. The planar shape of the second photoresist pattern 150P2 may be the same as the planar shape of the plurality of line patterns PB illustrated in FIG. 2B, for example, the second photoresist pattern 150P2 may have a shape of a plurality of lines.

In various embodiments, in the plan view, a dam structure DAM (see FIG. 2A (b)) may be later formed at the position of the hole H most adjacent (closest) to the edge of the first area AR1 of FIG. 3C. Also, in the plan view, a plurality of island patterns PA may be later formed at the position of the other holes H other than the hole H most adjacent (closest) to the edge of the first area AR1.

In simultaneously exposing the photoresist layer 150 in the first area AR1 and the second area AR2, EUV (13.5 nm), KrF excimer laser (248 nm), ArF excimer laser, or F2 excimer laser (157 nm), may be used as a light source.

For example, the first photoresist pattern 150P1 and the second photoresist pattern 150P2 may be formed through an EUV lithography process. In some embodiments, the first photoresist pattern 150P1 and the second photoresist pattern 150P2 may be formed together through an EUV lithography process, where the first area AR1 and the second area AR2 may be exposed simultaneously. In some embodiments, the first photoresist pattern 150P1 and the second photoresist pattern 150P2 may be formed respectively through separate EUV lithography processes.

Figure 3D:
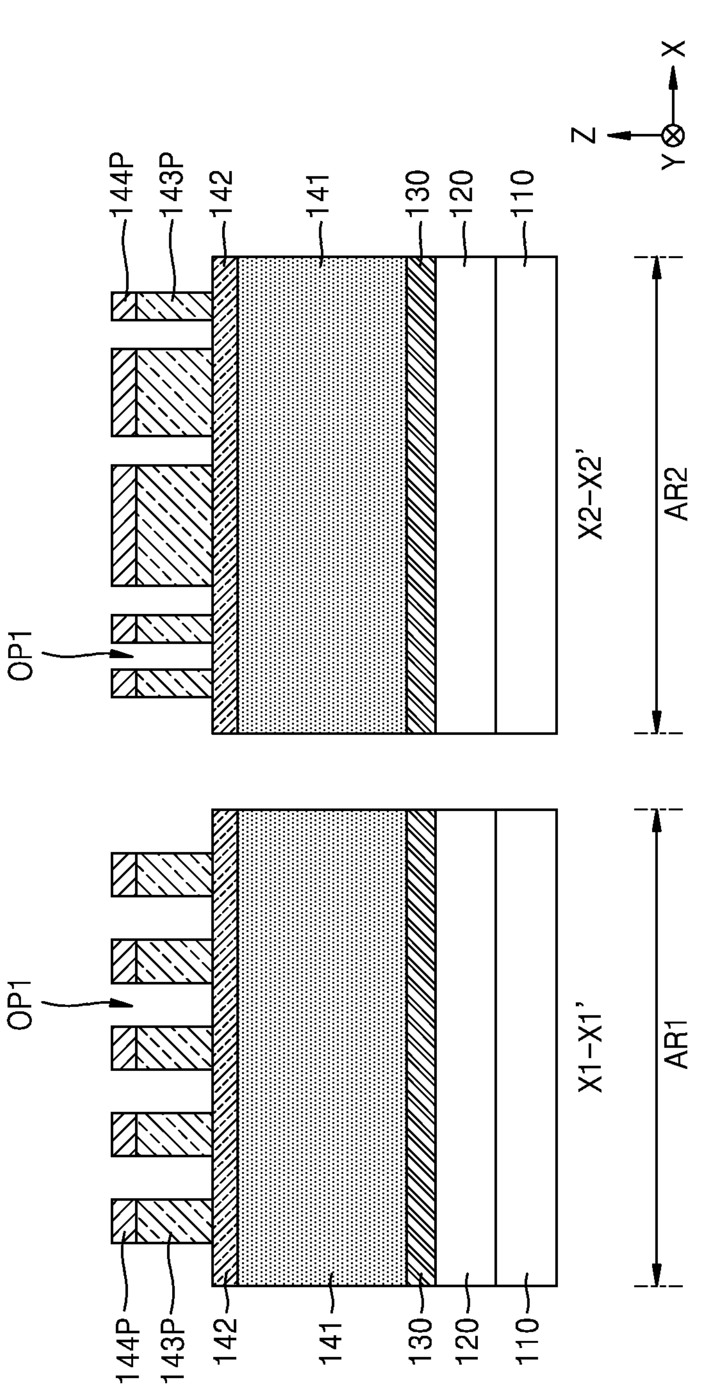

Referring to FIG. 3D, the shape of the photoresist pattern 150P can be transferred to the first anti-reflection layer 144 and the upper hardmask layer 143 to form a first anti-reflection layer pattern 144P and an upper hardmask pattern 143P, respectively. The first anti-reflection layer 144 and the upper hardmask layer 143 may be sequentially etched using the photoresist pattern 150P, as an etch mask in the first area AR1 and the second area AR2, to form the first anti-reflection layer pattern 144P and the upper hardmask pattern 143P.

The etching process can be performed until the upper hardmask pattern 143P and the first anti-reflection layer pattern 144P are obtained, where at least a portion of each of the photoresist pattern 150P, the first anti-reflection layer 144, and the upper hardmask layer 143 may be consumed in the etching process. The upper surface of the first anti-reflection layer pattern 144P may be exposed by removing materials remaining on the first anti-reflection layer pattern 144P. In the first area AR1 and the second area AR2, the upper hardmask pattern 143P and the first anti-reflection layer pattern 144P may include a plurality of first openings OP1, and a portion of the upper surface of the main hardmask layer 142 may be exposed through the plurality of first openings OP1. In the first area AR1, the planar shape of the plurality of first openings OP1 formed in the upper hardmask pattern 143P and the first anti-reflection layer pattern 144P may be the same as the planar shape of each of the plurality of island patterns PA and/or the dam structure DAM.

Figure 3E:
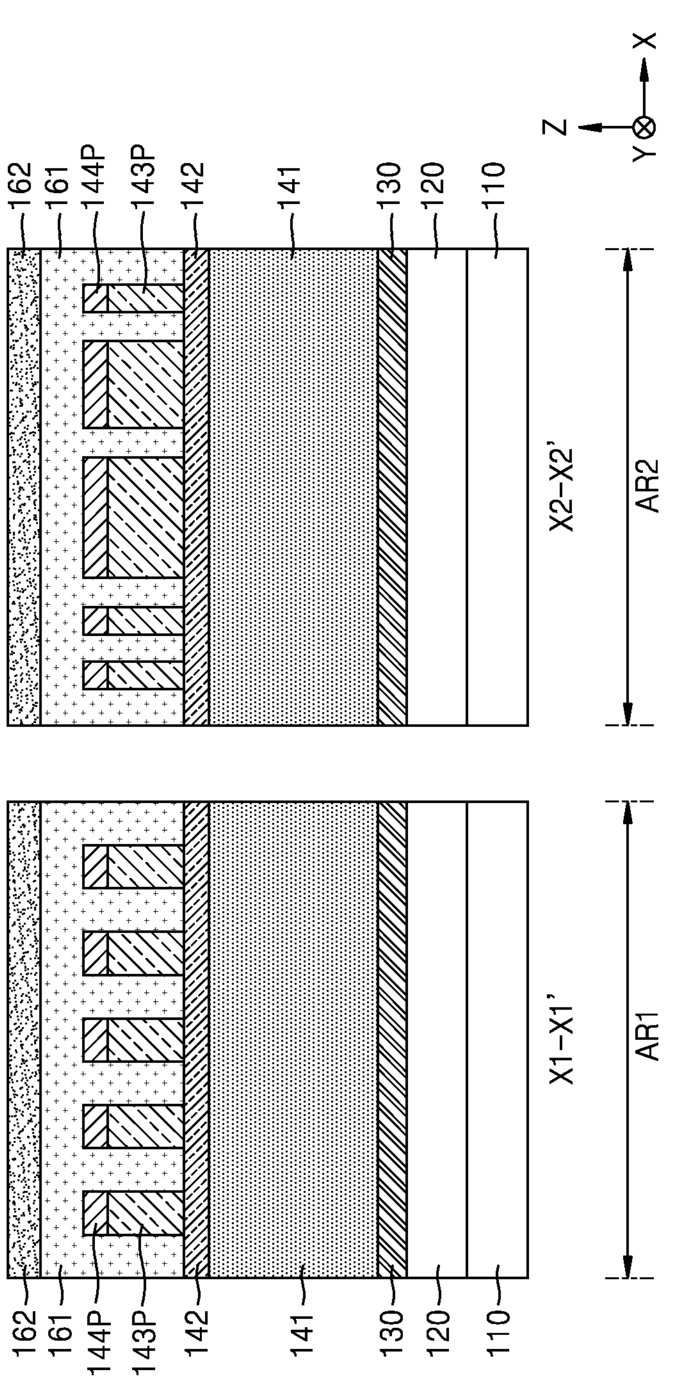

Referring to FIG. 3E, a gap-fill hardmask layer 161 and a second anti-reflection layer 162 may be formed on the exposed portions of the main hardmask layer 142, the upper hardmask pattern 143P, and the first anti-reflection layer pattern 144P, where the gap-fill hardmask layer 161 can cover the upper surfaces of the first anti-reflection layer pattern 144P. The gap-fill hardmask layer 161 may be formed to cover the upper surface of the first anti-reflection layer pattern 144P, while filling the plurality of first openings OP1 of the upper hardmask pattern 143P and the first anti-reflection layer pattern 144P in the first area AR1 and the second area AR2. The gap-fill hardmask layer 161 can fill the plurality of openings of the memory cell array and the peripheral circuit area to form a gap-fill hardmask pattern filling the plurality of openings in a memory cell array and the peripheral circuit area.

The second anti-reflection layer 162 may cover at least a portion of the upper surface of the gap-fill hardmask layer 161. For example, the second anti-reflection layer 162 may cover the entire upper surface of the gap-fill hardmask layer 161.

According to embodiments, the gap-fill hardmask layer 161 may include an SOH layer. In order to form the gap-fill hardmask layer 161, an SOH material layer with a thickness of about 500 Å to about 2,000 Å, including an organic compound, may be formed by a spin coating process. The SOH material may include a hydrocarbon compound including an aromatic ring, such as a phenyl, benzyl, or naphthyl group. The SOH material may include a material having a relatively high carbon content of about 85 wt % to about 99 wt % with respect to the total weight thereof. The SOH layer may be formed by curing the SOH material layer through a process of primarily baking the SOH material layer at a temperature of about 150° C. to about 350° C. for about 60 seconds and a process of secondarily baking the SOH material layer at a temperature of about 300° C. to about 550° C. for about 30 seconds to about 300 seconds.

The second anti-reflection layer 162 may include silicon nitride, silicon oxynitride, amorphous silicon, titanium, titanium dioxide, titanium nitride, chromium oxide, carbon, an organic ARC material, or a combination thereof. The second anti-reflection layer 162 may have a thickness of about 200 Å to about 400 Å. In embodiments, the second anti-reflection layer 162 may include the same material as the first anti-reflection layer 144. In some embodiments, the second anti-reflection layer 162 may include a different material than the first anti-reflection layer 144.

Figure 3F:
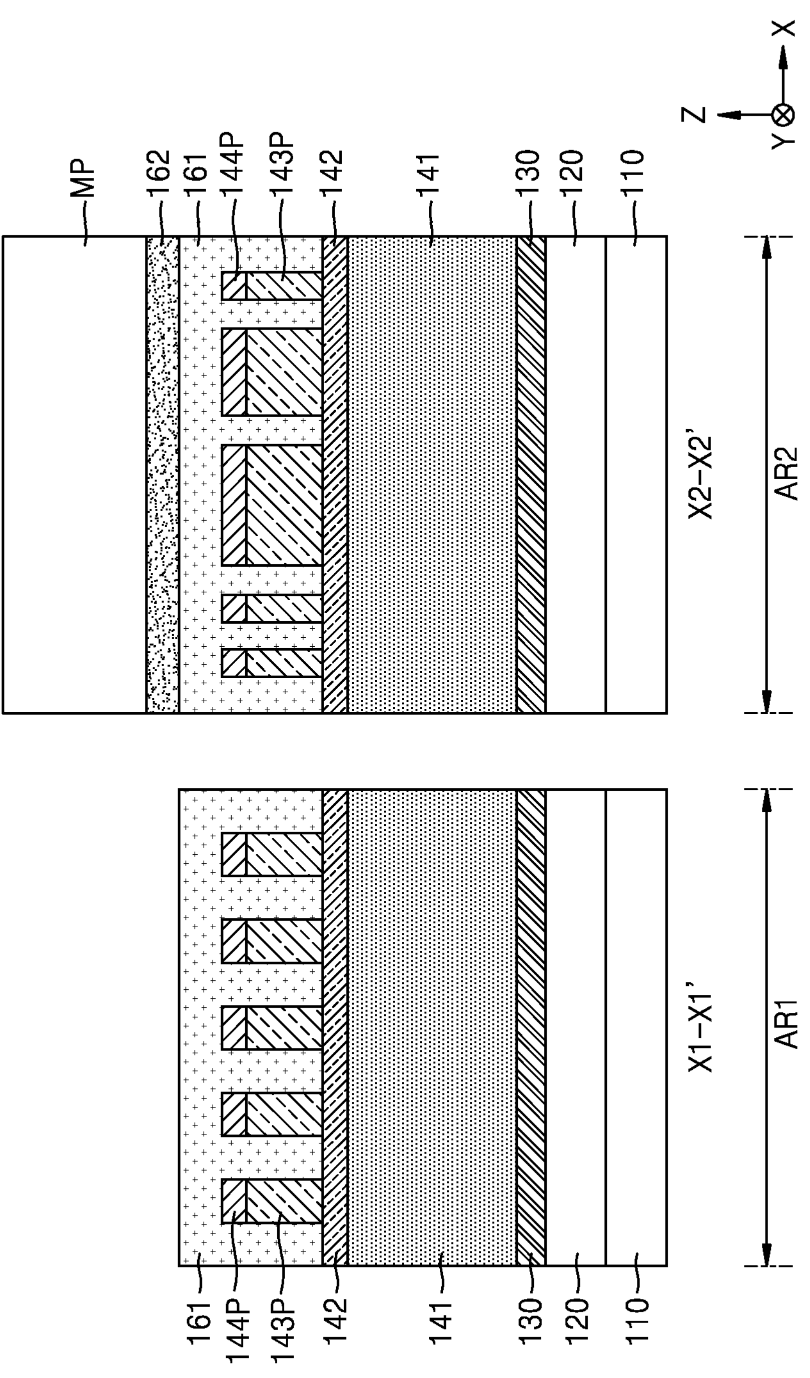

Referring to FIG. 3F, a mask pattern MP may be formed over the second area AR2, and the second anti-reflection layer 162 in the first area AR1 may be etched. The mask pattern MP may include a photoresist pattern. In embodiments, the mask pattern MP may include a resist for a KrF excimer laser (248 nm).

Figure 3G:
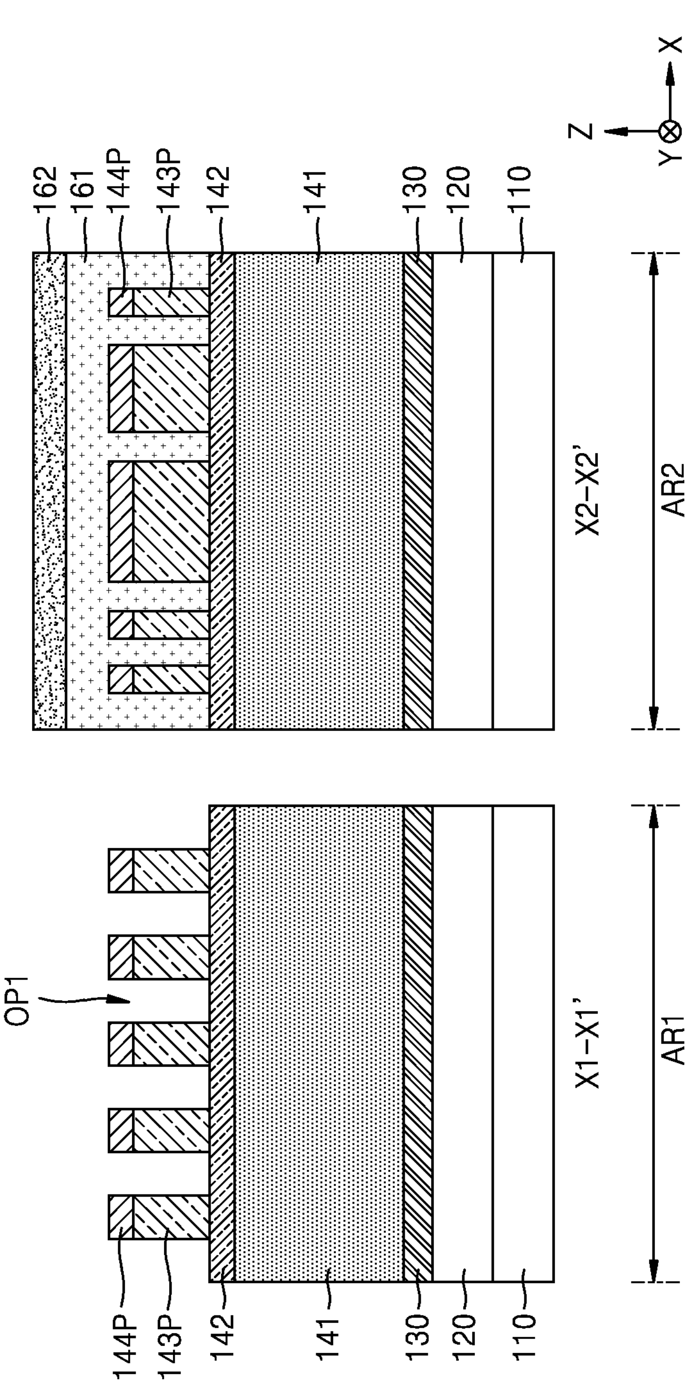

Referring to FIG. 3G, by using the mask pattern MP of the second area AR2, as an etch mask, the gap-fill hardmask layer 161 in the first area AR1 may be etched and removed, and an upper hardmask pattern 143P and a first anti-reflection layer pattern 144P may be exposed in the first area AR1. The upper surface of the first anti-reflection layer pattern 144P may be exposed by removing the gap-fill hardmask layer 161 from the first area AR1. In the first area AR1, the upper hardmask pattern 143P and the first anti-reflection layer pattern 144P may include a plurality of first openings OP1, and a portion of the upper surface of the main hardmask layer 142 may be exposed through the plurality of first openings OP1. As described above, in the first area AR1, the planar shape of the plurality of first openings OP1 formed by the upper hardmask pattern 143P and the first anti-reflection layer pattern 144P may be the same as the planar shape of each of the plurality of island patterns PA and/or the dam structure DAM illustrated in FIG. 2A.

Figure 3H:
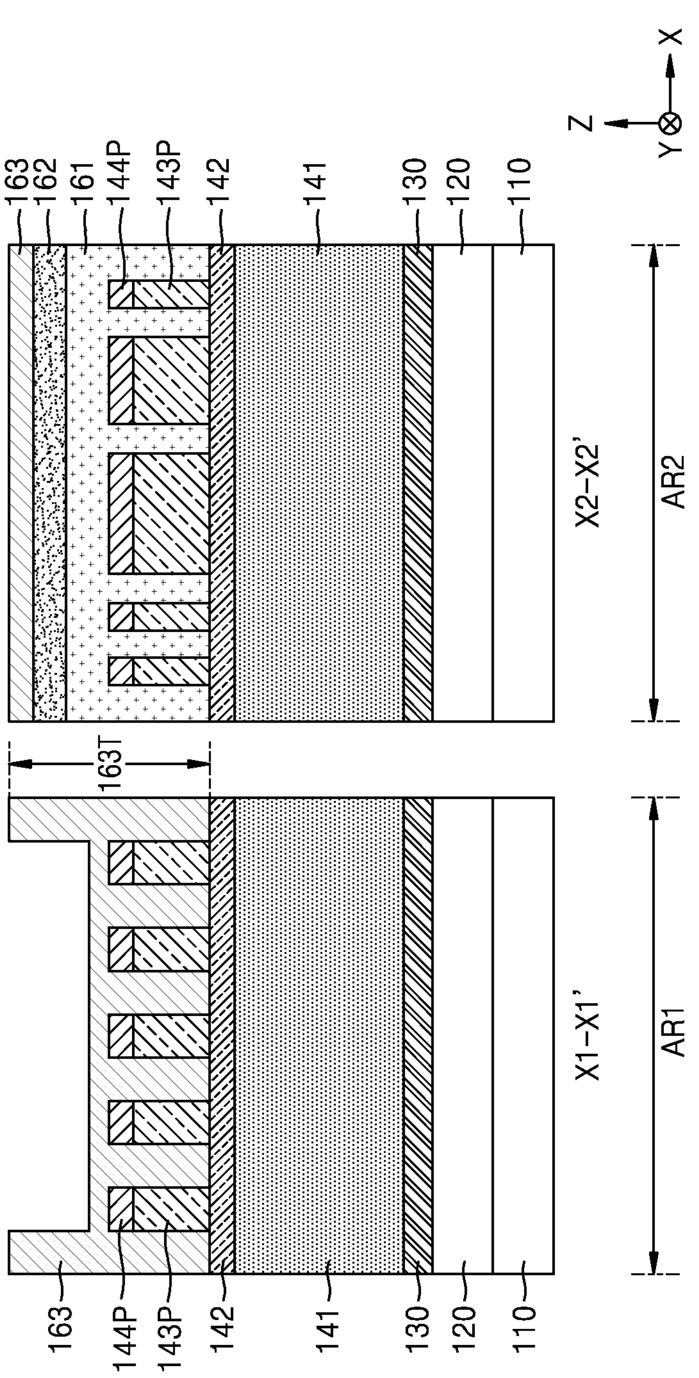

Referring to FIG. 3H, a reversible hardmask layer 163 may be applied on the resulting structure of FIG. 3G. In the first area AR1, the reversible hardmask layer 163 may be formed to cover the side surfaces of the upper hardmask pattern 143P, the side surface of the first anti-reflection layer pattern 144P, and the upper surface of the first anti-reflection layer pattern 144P, while filling the plurality of first openings OP1 of the upper hardmask pattern 143P and the first anti-reflection layer pattern 144P. Also, in the second area AR2, the reversible hardmask layer 163 may cover the upper surface of the second anti-reflection layer 162. The the reversible hardmask layer 163 may be the inverse profile of the upper hardmask pattern 143P, the side surface of the first anti-reflection layer pattern 144P.

In various embodiments, the reversible hardmask layer 163 may include, for example, an oxide layer. A thickness 163T of the reversible hardmask layer 163 may be, for example, about 30 Å to about 300 Å. The reversible hardmask layer 163 may be formed over the first area AR1 and the second area AR2, for example, by using an atomic layer deposition (ALD) method.

Figure 3I:
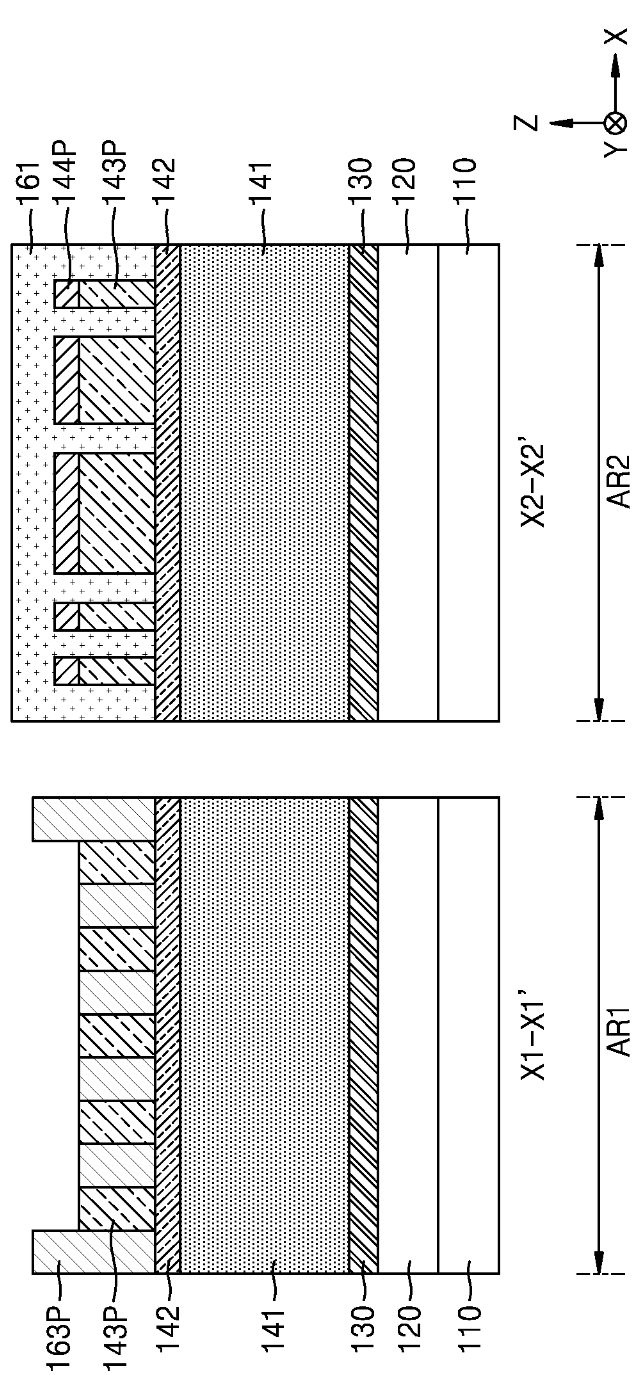

Referring to FIG. 3I, a portion of the reversible hardmask layer 163 formed in the first area AR1 may be etched back and removed. Also, the reversible hardmask layer 163 formed in the second area AR2 may be etched back and removed. Thereafter, the first anti-reflection layer pattern 144P formed in the first area AR1 may also be selectively removed. Also, the second anti-reflection layer 162 formed in the second area AR2 may be selectively removed. In the first area AR1, the upper hardmask pattern 143P and a reversible hardmask pattern 163P may remain on the main hardmask layer 142. Also, in the second area AR2, the upper hardmask pattern 143P, the first anti-reflection layer pattern 144P, and the gap-fill hardmask layer 161 may remain on the main hardmask layer 142.

Figure 3J:
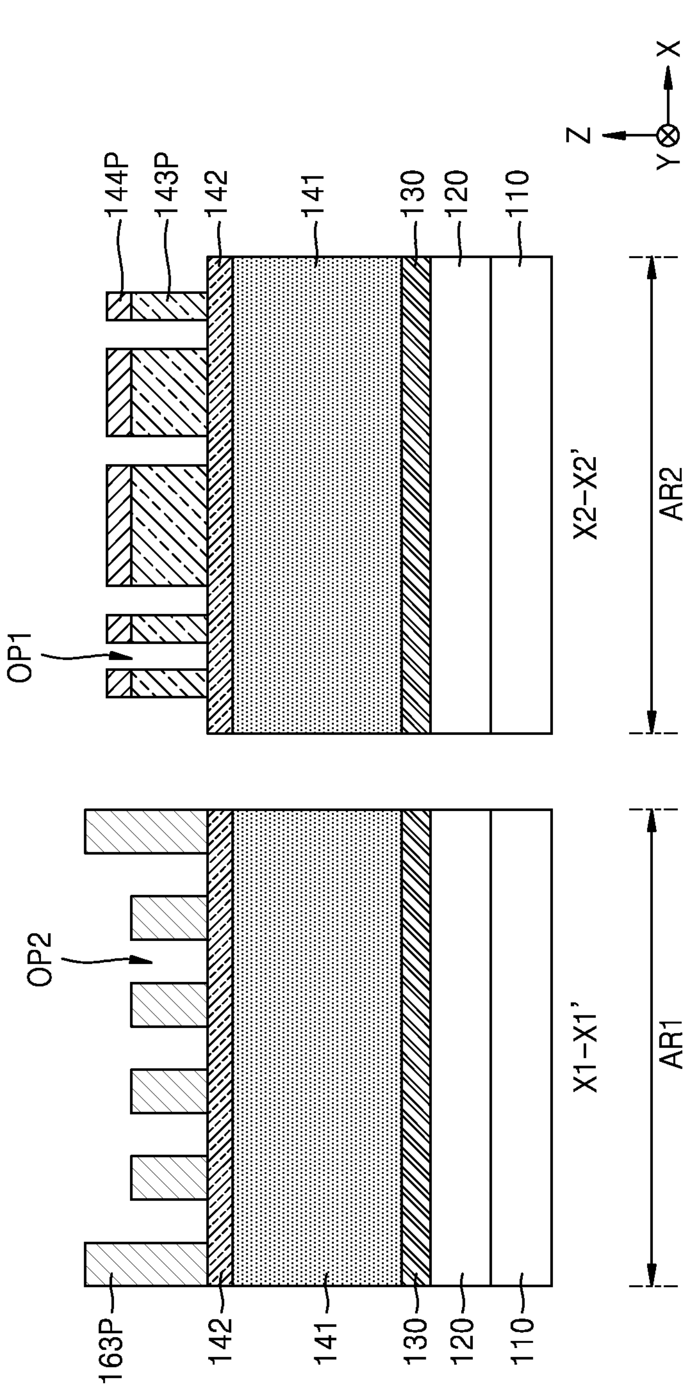

Referring to FIG. 3J, the upper hardmask pattern 143P formed in the first area AR1 may be selectively removed. Also, the gap-fill hardmask layer 161 formed in the second area AR2 may be selectively removed. For this purpose, an ashing and stripping process may be used. As a result, in the first area AR1, the reversible hardmask pattern 163P may remain on the main hardmask layer 142. Also, in the second area AR2, the upper hardmask pattern 143P and the first anti-reflection layer pattern 144P may remain on the main hardmask layer 142.

In the first area AR1, the reversible hardmask pattern 163P may include a plurality of second openings OP2, and a portion of the upper surface of the main hardmask layer 142 may be exposed through the plurality of second openings OP2. In the second area AR2, the upper hardmask pattern 143P and the first anti-reflection layer pattern 144P may include a plurality of first openings OP1, and a portion of the upper surface of the main hardmask layer 142 may be exposed through the plurality of first openings OP1. The plurality of first openings OP1 and the plurality of second openings OP2 may have different dimensions, that may be determined by the upper hardmask pattern 143P.

In the first area AR1, the planar shape of the reversible hardmask pattern 163P may be the same as the planar shape of each of the plurality of island patterns PA and/or the dam structure DAM illustrated in FIG. 2A. In the second area AR2, the planar shape of the upper hardmask pattern 143P and the first anti-reflection layer pattern 144P may be the same as the planar shape of the plurality of line patterns PB illustrated in FIG. 2B.

Figure 3K:
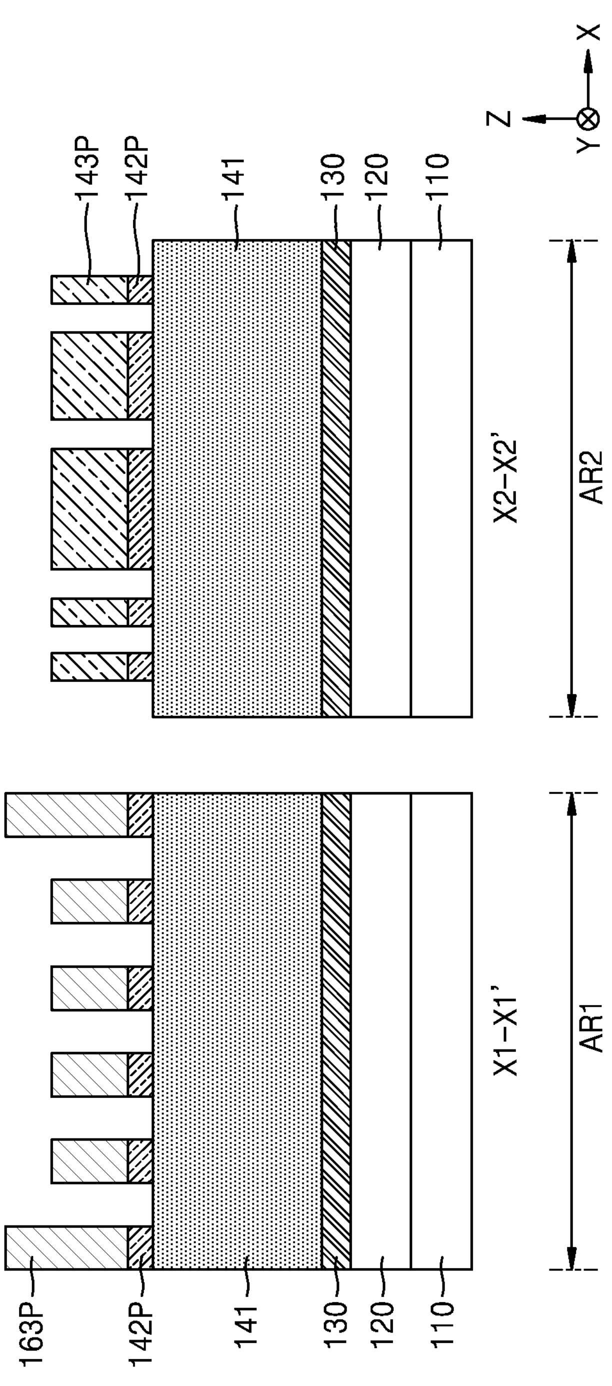

Referring to FIG. 3K, in the first area AR1, a main hardmask pattern 142P may be formed by etching the main hardmask layer 142 by using the reversible hardmask pattern 163P as an etch mask. In the second area AR2, a main hardmask pattern 142P may be formed by etching the main hardmask layer 142 by using the upper hardmask pattern 143P as an etch mask. The first anti-reflection layer pattern 144P above the upper hardmask pattern 143P may be selectively removed.

While the main hardmask layer 142 is etched, at least a portion of the reversible hardmask pattern 163P exposed to the etching atmosphere in the first area AR1 may be consumed and thus the height thereof may decrease. While the main hardmask layer 142 is etched, at least a portion of the upper hardmask pattern 143P exposed to the etching atmosphere in the second area AR2 may be consumed and thus the height thereof may decrease. The lower hardmask layer 141 may be used as an etch stop layer and may protect the etch target layer 130 thereunder. The lower hardmask layer 141 and the main hardmask layer 142 can be different layers selected from among a polysilicon layer, a silicon oxide layer, a silicon nitride layer, and an amorphous carbon layer (ACL).

Figure 3L:
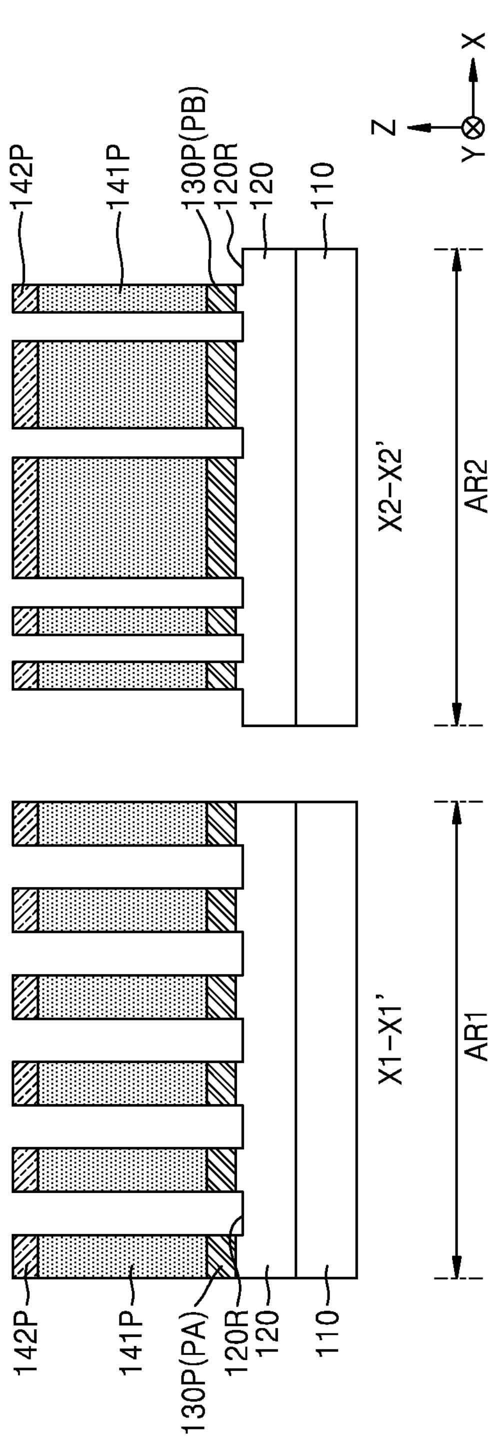

Referring to FIG. 3L, in the first area AR1, the reversible hardmask pattern 163P may be selectively removed. Also, in the second area AR2, the upper hardmask pattern 143P may be selectively removed. Thereafter, in the first area AR1 and the second area AR2, a lower hardmask pattern 141P may be formed by etching the lower hardmask layer 141 using the main hardmask pattern 142P as an etch mask, and subsequently, a feature pattern 130P may be formed by etching the etch target layer 130 using the main hardmask pattern 142P and the lower hardmask pattern 141P as an etch mask. A feature pattern 130P can include a first pattern located in the first area, where the first pattern can have a first pattern density, and a second pattern located in the second area, where the second pattern can have a second pattern density. The first pattern density in the first area can be greater than the second pattern density in the second area.

A portion of the feature pattern 130P in the first area AR1 may be a resulting structure obtained by transferring the shape of the reversible hardmask pattern 163P (see FIG. 3K) to the etch target layer 130, in the first area AR1 and may constitute the plurality of island patterns PA and the dam structure DAM illustrated in FIG. 2A. A portion of the feature pattern 130P in the second area AR2 may be a resulting structure obtained by transferring a portion of the upper hardmask pattern 143P (see FIG. 3K) to the etch target layer 130 in the second area AR2, and may constitute the plurality of line patterns PB illustrated in FIG. 2B.

During an etching process for forming the feature pattern 130P, at least some of the patterns over the feature pattern 130P may be consumed by the etching atmosphere. FIG. 3L illustrates a case where the lower hardmask pattern 141P and the main hardmask pattern 142P remain on the feature pattern 130P; however, the main hardmask pattern 142P may also be consumed by the etching atmosphere and only a portion of the lower hardmask pattern 141P may remain on the feature pattern 130P.

In embodiments, after the feature pattern 130P is formed, a portion of the lower structure 120 may be etched by overetching and thus a recess area 120R may be formed at the upper surface of the lower structure 120 in the first area AR1 and the second area AR2. In some embodiments, the recess area 120R may not be formed in at least one of the first area AR1 and the second area AR2. The recess area 120R can have a bottom surface below the level of the interface between upper surface of the lower structure 120 and the lower surface of the feature pattern 130P.

Figure 3M:
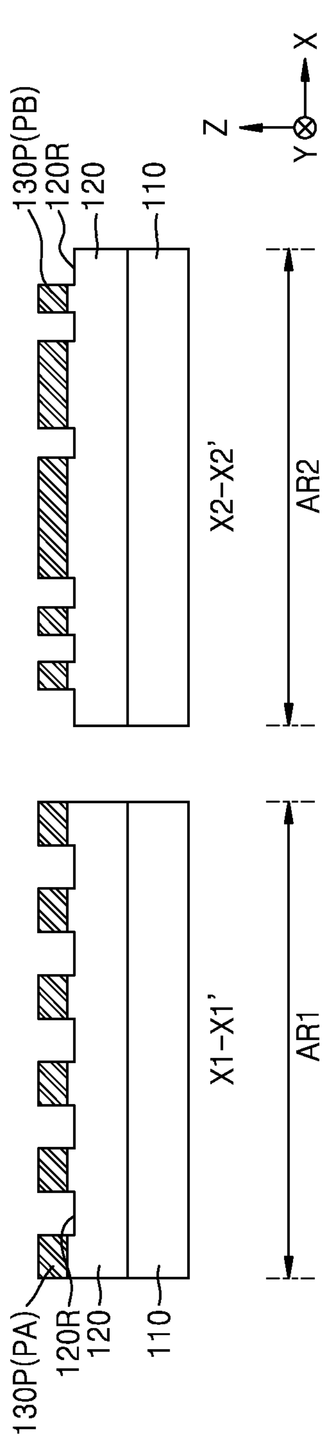

Referring to FIG. 3M, the upper surface of the feature pattern 130P may be exposed by removing unnecessary materials remaining on the feature pattern 130P. For this purpose, an ashing and stripping process may be used.

According to the pattern forming method according to embodiments described above with reference to FIGS. 3A to 3M, a pattern defect, such as a plurality of island patterns PA densely arranged at a relatively small pitch in the first area AR1 collapsing or attaching to each other of adjacent island patterns PA, may be prevented from occurring. The patterns in a plurality of areas AR1 and AR2 can be formed with different pattern densities over the substrate 110. Engraved patterning may be used in the first area AR1 with a relatively high pattern density, and embossed patterning may be used in the second area AR2 with a relatively low pattern density. A plurality of line patterns PB with various widths spaced apart from each other with spaces of various widths therebetween may be formed in a desired shape. Also, even when there is a pattern density difference, a pattern shape difference, a pattern size difference, or a pattern level difference between the plurality of areas, the process difficulty can remain the same. The occurrence of undesirable skew or dispersion degradation in the patterns simultaneously formed in the plurality of areas, or the occurrence of a process defect due to these differences may be reduced or avoided. The degree of freedom in design may be improved and the process margin may be maximized.

FIG. 4 is a block diagram illustrating a configuration of a semiconductor memory device according to an embodiment.

Referring to FIG. 4, a semiconductor memory device 200 may include a first area 22 (indicated by a solid box) and a second area 24 (indicated by the dashed box). The first area 22 may be a memory cell array of a DRAM device, and the second area 24 may be a peripheral circuit area of the DRAM device. The first area 22 may include a memory cell array 22A. The second area 24 may include a row decoder 52, a sense amplifier 54, a column decoder 56, a self-refresh control circuit 58, a command decoder 60, a mode register set/extended mode register set (MRS/EMRS) circuit 62, an address buffer 64, and a data input/output circuit 66.

Figure 5:
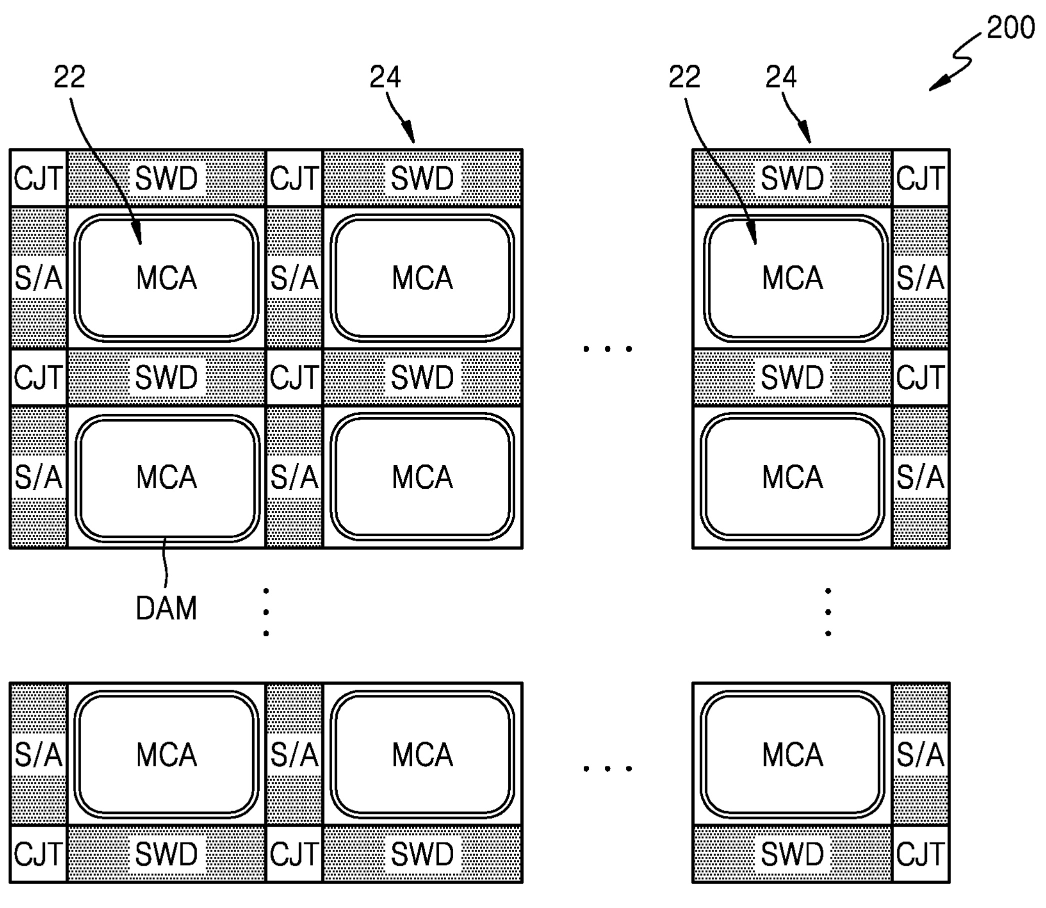
FIG. 5 is a plan view illustrating an arrangement configuration of the semiconductor memory device illustrated in FIG. 4.

FIG. 5 is a plan view illustrating an arrangement configuration of the semiconductor memory device 200 illustrated in FIG. 4.

Referring to FIG. 5, the semiconductor memory device 200 may include a plurality of first areas 22. Each of the plurality of first areas 22 may be surrounded by a second area 24. As described above, a dam structure DAM adjacent to the side of each of the plurality of first areas 22 and surrounding a plurality of island patterns PA (see FIG. 2A) may be arranged in each of the plurality of first areas 22.

Each of the plurality of first areas 22 may be a memory cell array MCA of the DRAM device, and the second area 24 may be a core area and an area in which peripheral circuits of the DRAM device are formed (hereinafter, referred to as a "peripheral circuit area"). In the plurality of first areas 22, the memory cell array MCA may include the memory cell array 22A described above with reference to FIG. 4.

In some embodiments, the semiconductor memory device 200 may include a plurality of dam structures DAM. Each of the plurality of dam structures DAM may have a tetragonal ring shape extending in the first horizontal direction (X direction) or the second horizontal direction (Y direction) along any one of the four sides of the rectangular shape of each of the plurality of first areas 22. The dam structures DAM can form a wall around the memory cell array MCA.

The second area 24 may include a sub-word line driver block SWD, a sense amplifier block S/A, and a conjunction block CJT. A plurality of bit line sense amplifiers may be arranged in the sense amplifier block S/A. The conjunction block CJT may be arranged at a point where the sub-word line driver block SWD and the sense amplifier block S/A intersect each other. Power drivers and ground drivers for driving the bit line sense amplifiers may be alternately arranged in the conjunction block CJT. A peripheral circuit such as an inverter chain or an input/output circuit may be further formed in the second area 24.

Figure 6A:
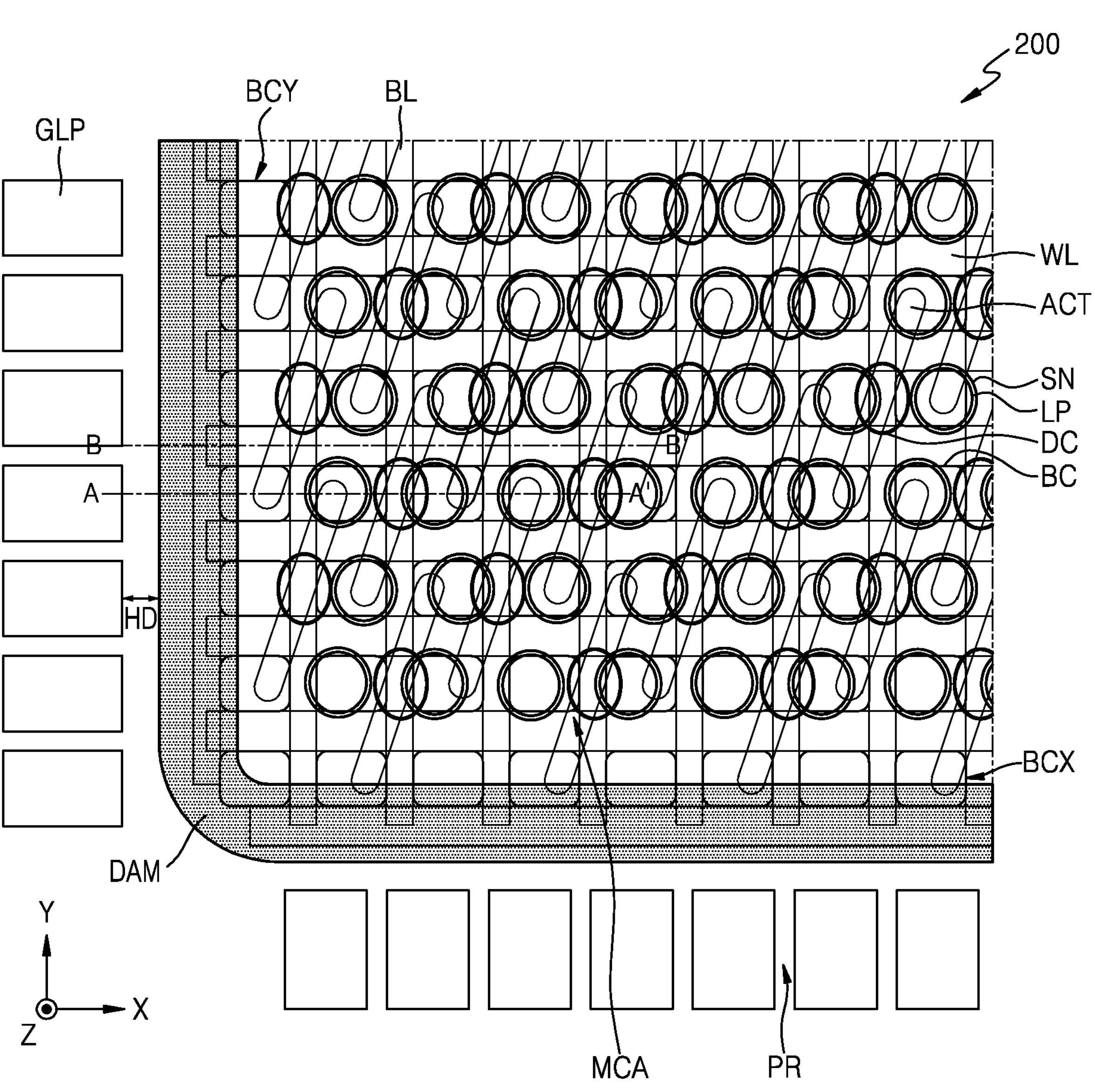
FIGS. 6A and 6B are schematic plan layout diagrams illustrating main components of a semiconductor memory device according to an embodiment.
Figure 6B:
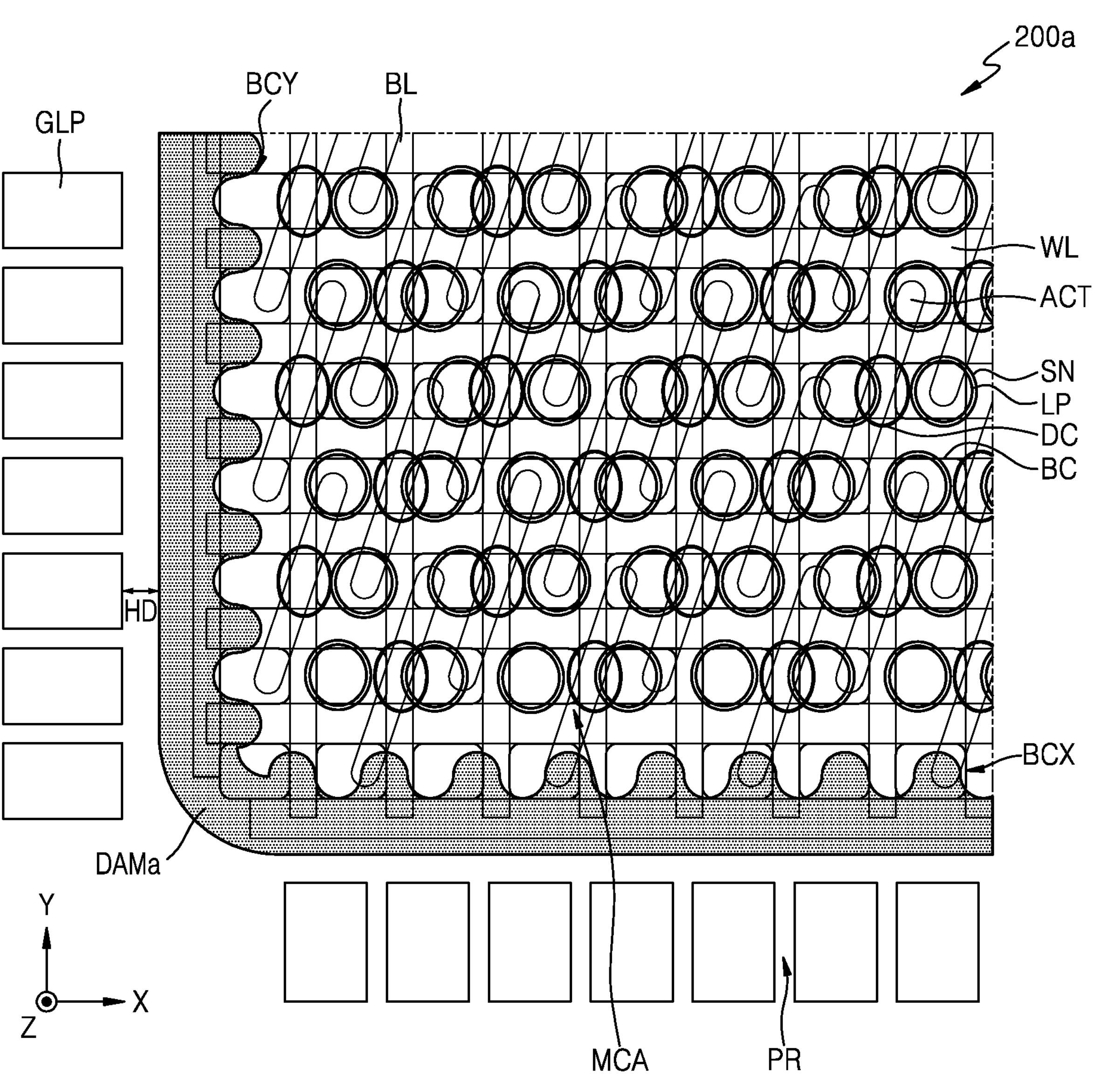

FIGS. 6A and 6B are schematic plan layout diagrams illustrating main components of a semiconductor memory device, according to an embodiment. More particularly, both the outer surface and the inner surface of a dam structure DAM of FIG. 6A may have an even (or flat) shape, and the outer surface of a dam structure DAMa of FIG. 6B may have an even shape and the inner surface of the dam structure DAMa may have an uneven structure.

Referring to FIG. 6A, the semiconductor memory device 200 may include a memory cell array MCA and a peripheral circuit area PR. A dam structure DAM may be arranged between the memory cell array MCA and the peripheral circuit area PR.

In various embodiments, the semiconductor memory device 200 may include a plurality of dam structures DAM. In the plan view, the plurality of dam structures DAM may be formed surrounding the memory cell array MCA. For example, in the plan view, the plurality of dam structures DAM may have a tetragonal ring shape (e.g., square or rectangular). A horizontal distance HD between the dam structure DAM and a plurality of gate line patterns GLP may be about 100 nm to about 300 nm.

In various embodiments, the semiconductor memory device 200 may include a plurality of active areas ACT formed in the memory cell array MCA. In some embodiments, the plurality of active areas ACT may be arranged to have a long axis in a diagonal direction with respect to the first horizontal direction (X direction) and the second horizontal direction (Y direction).

A plurality of word lines WL may extend in parallel to each other in the first horizontal direction (X direction) across the plurality of active areas ACT in the memory cell array MCA. Over the plurality of word lines WL, a plurality of bit lines BL may extend in parallel to each other in the second horizontal direction (Y direction) intersecting with the first horizontal direction (X direction). Storage nodes SN may be separated by word lines WL in a first horizontal direction, and bit lines BL in a second horizontal direction.

In various embodiments, the plurality of bit lines BL may be connected to the plurality of active areas ACT through a direct contact DC. In some embodiments, a plurality of buried contacts BC may be formed between two adjacent bit lines BL among the plurality of bit lines BL. In some embodiments, the plurality of buried contacts BC may be arranged in a line in each of the first horizontal direction (X direction) and the second horizontal direction (Y direction).

The plurality of buried contacts BC may include a plurality of first dummy buried contacts BCX and a plurality of second dummy buried contacts BCY. Among the plurality of buried contacts BC, some buried contacts BC adjacent to the dam structure DAM extending in the first horizontal direction (X direction) may be first dummy buried contacts BCX, and some buried contacts BC adjacent to the dam structure DAM extending in the second horizontal direction (Y direction) may be second dummy buried contacts BCY. A plurality of first dummy buried contacts BCX may be arranged in one line or in two or more lines in the first horizontal direction (X direction). A plurality of second dummy buried contacts BCY may be arranged in one line or in two or more lines in the second horizontal direction (Y direction).

A plurality of landing pads LP may be formed over the plurality of buried contacts BC. The plurality of landing pads LP may be arranged to at least partially overlap the plurality of buried contacts BC. In some embodiments, each of the plurality of landing pads LP may extend to an upper portion of one bit line BL among two bit lines BL adjacent to each other.

In various embodiments, the plurality of landing pads LP may not be formed over the first dummy buried contact BCX and the second dummy buried contact BCY among the plurality of buried contacts BC. In some embodiments, the plurality of landing pads LP may be formed over some of the plurality of first dummy buried contacts BCX and some of the plurality of second dummy buried contacts BCY and may not be formed over the others of the plurality of first dummy buried contacts BCX and the others of the plurality of second dummy buried contacts BCY. For example, when the plurality of first dummy buried contacts BCX are arranged in two or more lines in the first horizontal direction (X direction), the landing pad LP may not be formed over some first dummy buried contacts BCX arranged adjacent to the dam structure DAM in one line in the first horizontal direction (X direction) among the plurality of first dummy buried contacts BCX and may be formed over the other first dummy buried contacts BCX. Likewise, for example, when the plurality of second dummy buried contacts BCY are arranged in two or more lines in the second horizontal direction (Y direction), the landing pad LP may not be formed over some second dummy buried contacts BCY arranged adjacent to the dam structure DAM in one line in the second horizontal direction (Y direction) among the plurality of second dummy buried contacts BCY and may be formed over the other second dummy buried contacts BCY.

A plurality of storage nodes SN may be formed over the plurality of landing pads LP. The plurality of storage nodes SN may be formed over the plurality of bit lines BL. Each of the plurality of storage nodes SN may be a lower electrode of each of a plurality of capacitors. The storage node SN may be connected to the active area ACT through the landing pad LP and the buried contact BC.

The dam structure DAM may be formed to extend in the first horizontal direction (X direction) or the second horizontal direction (Y direction) over some of the plurality of buried contacts BC.

A plurality of gate line patterns GLP may be arranged in the peripheral circuit area PR, where the gate line patterns GLP may be around the active area ACT and spaced apart from the dam structure DAM by a horizontal distance HD. Components other than the plurality of gate line patterns GLP in the peripheral circuit area PR will be omitted for convenience of illustration. The plurality of gate line patterns GLP may extend from a portion close to the memory cell array MCA to a portion distant therefrom; however, the inventive concept is not limited thereto. Also, the shape of the plurality of gate line patterns GLP illustrated in FIGS. 6A and 6B is only an example, and each of the plurality of gate line patterns GLP may have various widths, may have curvature, or may extend in various horizontal directions while varying in width.

The plurality of gate line patterns GLP may be formed at the same level as the plurality of bit lines BL. In some embodiments, the plurality of gate line patterns GLP and the plurality of bit lines BL may include the same material, or at least some thereof may include the same material. For example, a process of forming all or some of the plurality of gate line patterns GLP and all or some of the processes of forming the plurality of bit lines BL may be the same process.

Referring to FIG. 6B, the semiconductor memory device 200*a* may include a memory cell array MCA and a peripheral circuit area PR. A dam structure DAMa may be arranged between the memory cell array MCA and the peripheral circuit area PR.

The inner surface of a dam structure DAMa may have an uneven shape. Conversely, the outer surface of the dam structure DAMa may have an even shape. In more detail, the distance between the dam structure DAMa and the outermost landing pad LP may be greater than the distance between the dam structure DAM and the outermost landing pad LP of FIG. 6A. As described above, the outermost landing pad LP may be a dummy landing pad. Thus, because the distance between the dam structure DAMa and the landing pad LP increases, a margin for forming the plurality of landing pads LP may increase.

Because the dam structure DAMa can be formed by engraved patterning, the inner surface of the dam structure DAMa may have an uneven shape and the outer surface of the dam structure DAMa may have an even shape. Thus, because the distance between the dam structure DAMa and the landing pad LP increases, a process margin for forming the landing pad LP may be secured.

Figure 7:
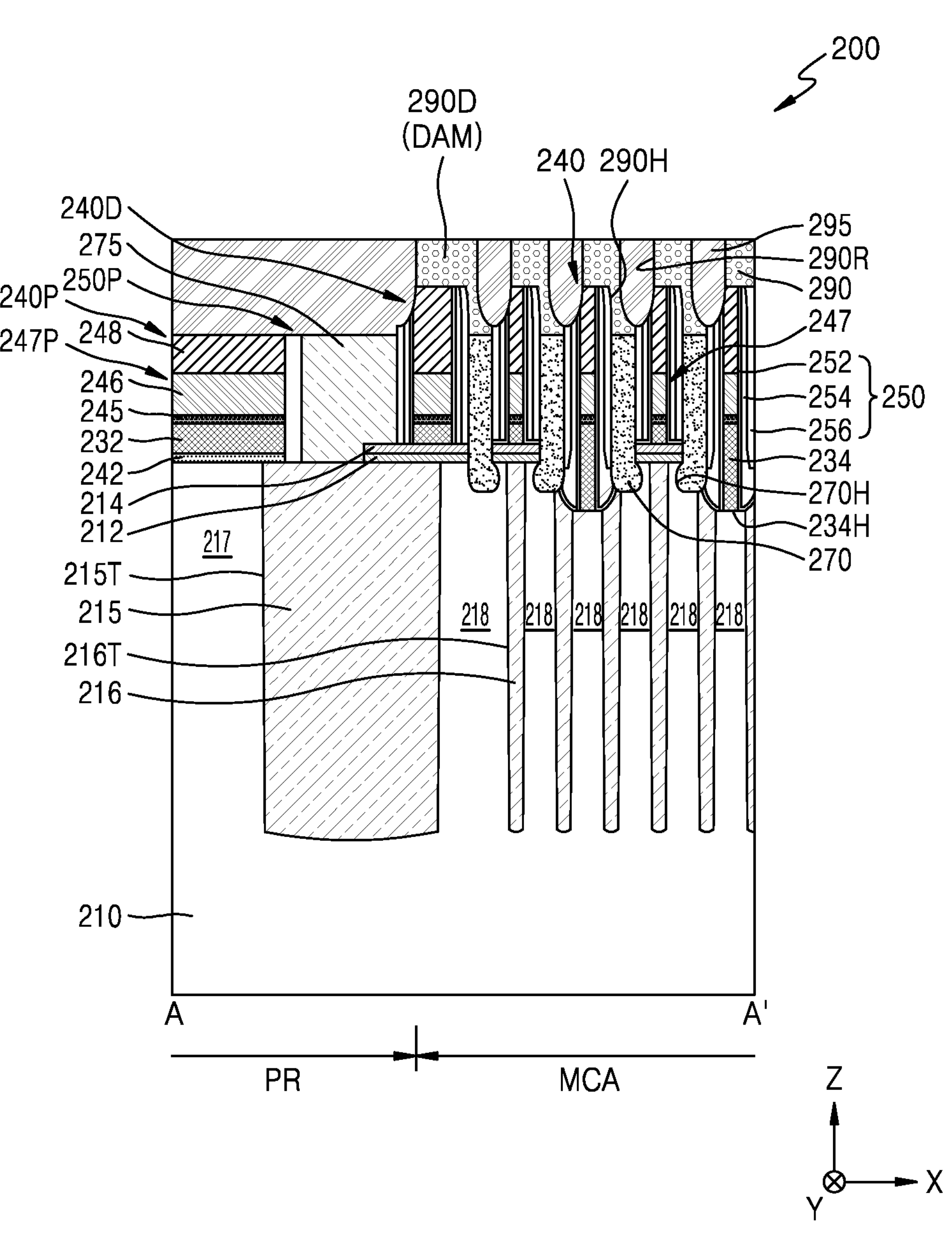
FIGS. 7 and 8 are cross-sectional views illustrating a configuration of the semiconductor memory device of FIG. 6A.
Figure 8:
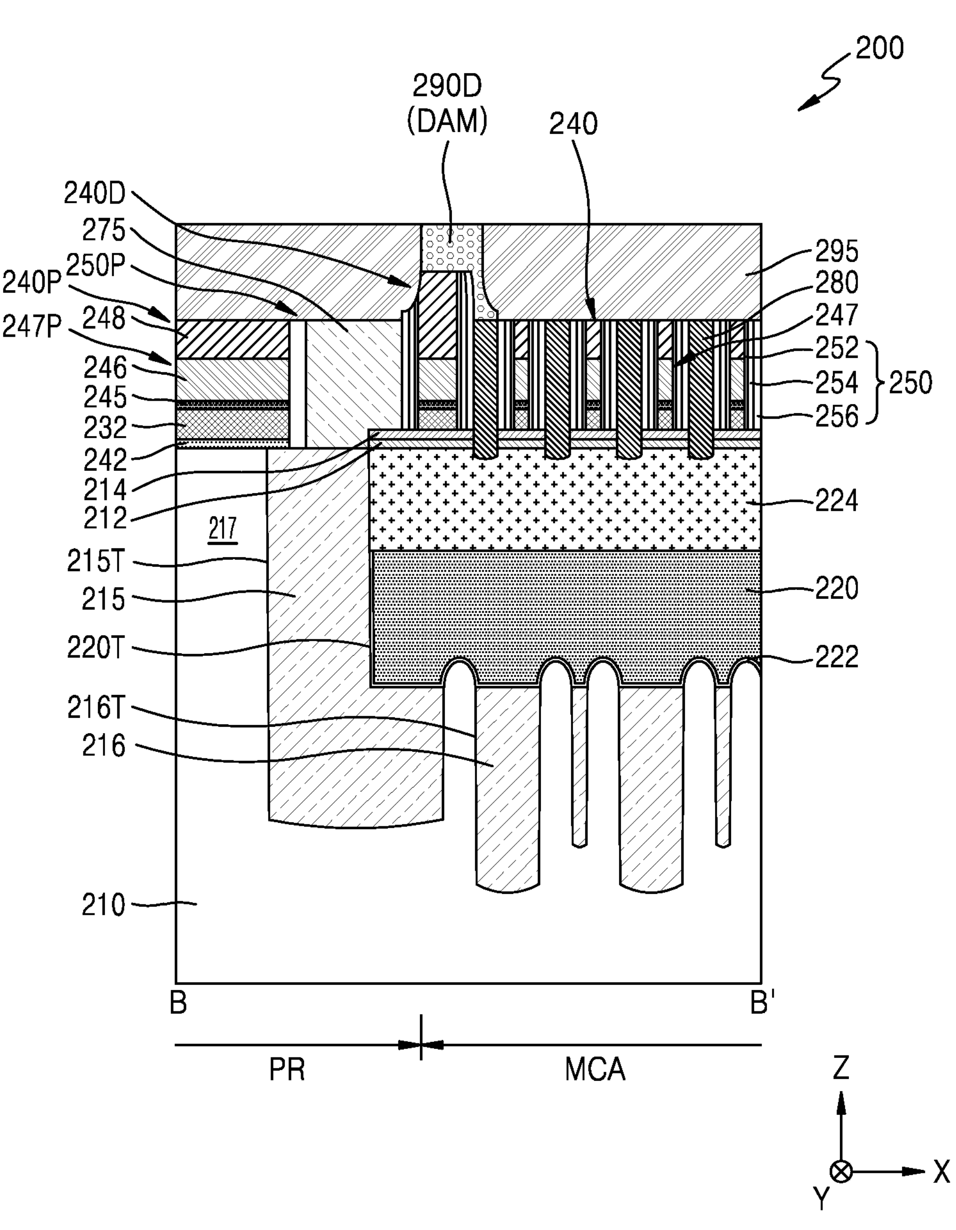

FIGS. 7 and 8 are cross-sectional views illustrating a configuration of the semiconductor memory device 200 of FIG. 6A. FIGS. 7 and 8 respectively illustrate cross-sectional configurations of partial areas of the memory cell array MCA and the peripheral circuit area PR. Particularly, FIG. 7 illustrates a cross-sectional configuration of a partial area taken along line A-A' of FIG. 6A, and FIG. 8 illustrates a cross-sectional configuration of a partial area taken along line B-B' of FIG. 6A. Descriptions thereof will be given below with reference to FIG. 6A together.

Referring to FIGS. 7 and 8, the semiconductor memory device 200 may include a substrate 210 including a memory cell array MCA and a peripheral circuit area PR. The substrate 210 may include, for example, silicon (Si), such as crystalline Si, polycrystalline Si, or amorphous Si. Alternatively, the substrate 210 may include a semiconductor element such as germanium (Ge) or at least one compound semiconductor selected from among silicon germanium (SiGe), silicon carbide (SiC), gallium arsenide (GaAs), indium arsenide (InAs), and indium phosphide (InP). Alternatively, the substrate 210 may have a silicon-on-insulator (SOI) structure. For example, the substrate 210 may include a buried oxide (BOX) layer. The substrate 210 may include a conductive area such as a well doped with dopants or a structure doped with dopants.

An area isolation trench 215T may be formed in the substrate 210, and an area isolation layer 215 may be formed in the area isolation trench 215T. The area isolation layer 215 may be formed to be arranged along and between the memory cell array MCA and the peripheral circuit area PR, where the area isolation layer 215 can electrically separate the memory cell array MCA from the peripheral circuit area PR. A logic active area 217 may be defined in the peripheral circuit area PR of the substrate 210 by the area isolation layer 215, where the logic active area 217 may be adjacent to the area isolation layer 215.

In various embodiments, a device isolation trench 216T may be formed in the memory cell array MCA of the substrate 210, and a device isolation layer 216 may be formed in the device isolation trench 216T. A plurality of active areas 218 of the memory cell array MCA of the substrate 210 may be defined by the device isolation layer 216. The active area 218 may have a relatively long island shape having a short axis and a long axis, like the active area ACT illustrated in FIG. 6A.

In the memory cell array MCA, a plurality of word line trenches 220T extending in the first horizontal direction (X direction) may be formed in the substrate 210, and a plurality of word lines 220, a plurality of gate dielectric layers 222, and a plurality of buried insulating layers 224 may be formed in the plurality of word line trenches 220T, as shown in FIG. 8. The plurality of word lines 220 may constitute the plurality of word lines WL illustrated in FIG. 6A.

For example, the plurality of word lines 220 may include Ti, TiN, Ta, TaN, W, WN, TiSiN, WSiN, or combinations thereof. The gate dielectric layer 222 may include at least one of a silicon oxide layer, a silicon nitride layer, a silicon oxynitride layer, an oxide/nitride/oxide (ONO) layer, or a high-k dielectric layer having a higher dielectric constant than the silicon oxide layer. For example, the gate dielectric layer 222 may have a dielectric constant of about 10 to about 25.

Also, insulating layer patterns 212 and 214 may be arranged to cover the upper surface of the substrate 210 with the area isolation layer 215, the device isolation layer 216, the logic active area 217, the plurality of active areas 218, and the plurality of buried insulating layers 224 formed therein. For example, the insulating layer patterns 212 and 214 may include a silicon oxide layer, a silicon nitride layer, a silicon oxynitride layer, a metal-based dielectric layer, or combinations thereof.

In various embodiments, the insulating layer patterns 212 and 214 may include a stack of a plurality of insulating layers including a first insulating layer pattern and a second insulating layer pattern. The first insulating layer pattern and the second insulating layer pattern may be made of different materials, where for example, the second insulating layer pattern may have a higher dielectric constant than the first insulating layer pattern. In some embodiments, the first insulating layer pattern may include a silicon oxide layer and the second insulating layer pattern may include a silicon oxynitride layer. In some embodiments, the first insulating layer pattern may include a nonmetal-based dielectric layer and the second insulating layer pattern may include a metal-based dielectric layer.

A direct contact hole 234H passing through the insulating layer patterns 212 and 214 may be formed in the memory cell array MCA, and a direct contact conductive pattern 234 may be formed in the direct contact hole 234H, as shown in FIG. 7. The direct contact hole 234H may be formed to expose a source area in the active area 218. In some embodiments, the direct contact hole 234H may extend into the active area 218, for example, into the source area. The direct contact conductive pattern 234 may be connected to the plurality of active areas 218. A plurality of direct contact conductive patterns 234 may constitute a plurality of direct contacts DC illustrated in FIG. 6A.

In the memory cell array MCA, a plurality of bit lines 247 including a first metal-based conductive pattern 245 and a second metal-based conductive pattern 246 may constitute a plurality of memory cells in a memory cell array. In the peripheral circuit area PR, a plurality of gate lines 247P including a first metal-based conductive pattern 245 and a second metal-based conductive pattern 246 may constitute a plurality of logic transistors.

In various embodiments, the first metal-based conductive pattern 245 may include titanium nitride (TiN) or Ti—Si—N (TSN) and the second metal-based conductive pattern 246 may include tungsten (W) or tungsten silicide ($WSi_x$). In some embodiments, the first metal-based conductive pattern 245 may function as a diffusion barrier.

In the memory cell array MCA, a bit line structure 240 may include a bit line 247 and an insulating capping line 248 covering the bit line 247 and in the peripheral circuit area PR, a gate line structure 240P may include a gate line 247P and an insulating capping line 248 covering the gate line 247P. A gate insulating layer pattern 242 may be arranged between the gate line 247P and the logic active area 217, where the gate insulating layer pattern 242 can electrically separate the logic active area 217 from a conductive semiconductor pattern 232.

In some embodiments, each of the bit line structure 240 and the gate line structure 240P may further include a conductive semiconductor pattern 232 arranged between the insulating layer patterns 212 and 214 and the first metal-based conductive pattern 245. The conductive semiconductor pattern 232 may include doped polysilicon. In some embodiments, the conductive semiconductor pattern 232 may be omitted without being formed.

Like the bit line structure 240, a dummy bit line structure 240D including a plurality of bit lines 247 and a plurality of insulating capping lines 248 may extend in the second horizontal direction (Y direction). The width of the dummy bit line structure 240D in the first horizontal direction (X direction) may be greater than the width of the bit line structure 240; however, the inventive concept is not limited thereto. In some embodiments, the width of the dummy bit line structure 240D and the width of the bit line structure 240 in the first horizontal direction (X direction) may be equal to each other.

The plurality of bit lines 247 may constitute the plurality of bit lines BL illustrated in FIG. 6A. The plurality of gate lines 247P may constitute the plurality of gate line patterns GLP illustrated in FIG. 6A. The plurality of bit lines 247 may be electrically connected to the plurality of active areas 218 through the plurality of direct contact conductive patterns 234.

In various embodiments, an insulating spacer structure 250 may cover both sidewalls of each of a plurality of bit line structures 240, where the insulating spacer structure 250 may separate the bit line structures 240 from an adjacent insulating fences 280. Each of a plurality of insulating spacer structures 250 may include a first insulating spacer 252, a second insulating spacer 254, and a third insulating spacer 256. The second insulating spacer 254 may include a material having a lower dielectric constant than the first insulating spacer 252 and the third insulating spacer 256. In some embodiments, the first insulating spacer 252 and the third insulating spacer 256 may include a nitride layer, and the second insulating spacer 254 may include an oxide layer. In some embodiments, the first insulating spacer 252 and the third insulating spacer 256 may include a nitride layer, and the second insulating spacer 254 may include a material having an etch selectivity with respect to the first insulating spacer 252 and the third insulating spacer 256.

A gate insulating spacer 250P may cover the sidewall of the gate line structure 240P, and first filling insulating layer 275. The gate insulating spacer 250P may include, for example, a nitride layer. In some embodiments, the gate insulating spacer 250P may include a single layer; however, the inventive concept is not limited thereto, and the gate insulating spacer 250P may include a stack structure of two or more layers.

In the memory cell array MCA, a plurality of buried contacts 270 and a plurality of insulating fences 280 may be arranged in the space between the plurality of insulating spacer structures 250 covering both sidewalls of each of the plurality of bit line structures 240. The plurality of buried contacts 270 and the plurality of insulating fences 280 may be alternately arranged along and between a pair of insulating spacer structures 250 among the plurality of insulating spacer structures 250 covering both sidewalls of the plurality of bit line structures 240, that is, in the second horizontal direction (Y direction).

In some embodiments, the plurality of buried contacts 270 may be arranged in a line in each of the first horizontal direction (X direction) and the second horizontal direction (Y direction). Each of the plurality of buried contacts 270 may extend from the active area 218 in the vertical direction (Z direction) perpendicular to the substrate 210. The plurality of buried contacts 270 may constitute the plurality of buried contacts BC illustrated in FIG. 6A.

The plurality of buried contacts 270 may be arranged in the space defined by the plurality of insulating fences 280 and the plurality of insulating spacer structures 250 covering both sidewalls of the plurality of bit line structures 240, as shown in FIG. 8. The plurality of buried contacts 270 may be formed filling a plurality of buried contact holes 270H. The plurality of buried contacts 270 may constitute the plurality of buried contacts BC illustrated in FIG. 6A.

A plurality of landing pads 290 may be arranged over the plurality of buried contacts 270 in the memory cell array MCA and may extend onto the plurality of bit lines 247. The plurality of landing pads 290 may be arranged over the plurality of buried contacts 270 and electrically connected to the plurality of buried contacts 270 corresponding thereto. The plurality of landing pads 290 may be connected to the active area 218 through the plurality of buried contacts 270. The plurality of landing pads 290 may constitute the plurality of landing pads LP illustrated in FIG. 6A. The upper surface of each of the plurality of landing pads 290 may have a disc shape having substantially circular edges rather than elliptical edges.

The buried contact 270 may be arranged between two adjacent bit line structures 240, and the landing pad 290 may extend onto one bit line structure 240 from between two bit lines structures 240 adjacent to each other with the buried contact 270 therebetween, as shown in FIG. 7. The landing pad 290 may be electrically connected to the buried contact 270, and may be formed to extend to an upper portion of one bit line structure 240 from between two bit line structures 240 adjacent to each other with the buried contact 270 therebetween, so as to vertically overlap one bit line structure 240.

The plurality of landing pads 290 may be spaced apart from each other with a recess portion 290R therebetween.

The plurality of landing pads 290 may be formed filling a plurality of landing pad holes 290H.

In some embodiments, a metal silicide layer may be formed over the plurality of buried contacts 270 before forming the plurality of landing pads 290. The metal silicide layer may be arranged between the plurality of buried contacts 270 and the plurality of landing pads 290. The metal silicide layer may include cobalt silicide ($CoSi_x$), nickel silicide ($NiSi_x$), or manganese silicide ($MnSi_x$); however, the inventive concept is not limited thereto.

In some embodiments, the plurality of landing pads 290 may include a conductive barrier layer and a conductive pad material layer over the conductive barrier layer. For example, the conductive barrier layer may include metal, conductive metal nitride, or a combination thereof. In some embodiments, the conductive barrier layer may have a Ti/TiN stack structure. For example, the conductive pad material layer may include metal. In some embodiments, the conductive pad material layer may include tungsten (W).

A dam structure 290D may be separately formed such that a portion of the conductive pad material layer is arranged in the memory cell array MCA. The dam structure 290D may have the shape of the dam structures DMA and DMAa of FIGS. 6A and 6B in the plan view. For example, the dam structure 290D may have a tetragonal ring shape surrounding the memory cell array MCA.

Because the plurality of landing pads 290 and the dam structure 290D are formed from the conductive pad material layer, they may be located at the same vertical level, as shown in FIG. 7. The upper surface and the lower surface of the dam structure 290D may be at the same levels as the upper surface and the lower surface of the plurality of landing pads 290, respectively.

Also, the plurality of landing pads 290 and the plurality of gate lines 247P may be located at different vertical levels. Thus, the dam structure 290D may be located at a different vertical level than the plurality of gate lines 247P. For example, the plurality of landing pads 290 may be located at a vertical level higher than the vertical level of the plurality of gate lines 247P.

The plurality of landing pads 290 may be electrically insulated from each other by an insulating structure 295 filling a plurality of recess portions 290R. The insulating structure 295 may include a silicon nitride layer, a silicon oxide layer, or a combination thereof. In some embodiments, the insulating structure 295 may include an interlayer insulating layer and an etch stop layer. For example, the interlayer insulating layer may include an oxide layer, and the etch stop layer may include a nitride layer. Also, the insulating structure 295 may be arranged over a plurality of gate line structures 240P.

Herein, the peripheral circuit area PR is illustrated as being filled with an insulating material such as a first filling insulating layer 275 and the insulating structure 295, except for the plurality of gate line structures 240P; however, this is only an example, and a plurality of conductive lines and other components electrically connected to the logic active area 217 and/or the plurality of gate lines 247P may be formed therein.

While the inventive concept has been particularly shown and described with reference to embodiments thereof, it will be understood that various changes in form and details may be made therein without departing from the spirit and scope of the following claims.

What is claimed is:

1. A method of forming a pattern, the method comprising:
- forming an etch target layer over a substrate including a first area and a second area;
- forming a hardmask structure comprising a plurality of hardmask layers, over the etch target layer in the first area and the second area;
- forming a photoresist layer over the hardmask structure in the first area and the second area;
- forming a first photoresist pattern comprising an engraved pattern in the first area and a second photoresist pattern comprising an embossed pattern in the second area from the photoresist layer;
- forming, in the first area and the second area, an upper hardmask pattern including a plurality of openings by transferring a shape of the first and second photoresist patterns to an upper hardmask layer;
- forming a gap-fill hardmask layer filling the plurality of openings in the first area and the second area;
- removing the gap-fill hardmask layer from the first area while maintaining the gap-fill hardmask layer in the second area;
- forming a reversible hardmask layer over the first area and the second area;
- removing the reversible hardmask layer from the second area to form a reversible hardmask pattern in the first area; and
- forming a feature pattern comprising a first pattern in the first area and a second pattern in the second area, by transferring a shape of the reversible hardmask pattern to the etch target layer in the first area and transferring a shape of the upper hardmask pattern to the etch target layer in the second area,
  - wherein the first pattern comprises a plurality of island patterns and a dam structure surrounding the plurality of island patterns.

2. The method of claim 1, wherein the dam structure has a shape and surrounds the first area.

3. The method of claim 1, wherein, the dam structure has a tetragonal ring shape and a vertex with a curvature.

4. The method of claim 1, wherein the plurality of island patterns are spaced apart from each other and form a regular arrangement, and
- the second pattern comprises a plurality of line patterns having a nonuniform width and length and spaced apart from each other with a space of a nonuniform size therebetween.

5. The method of claim 1, wherein the forming of the reversible hardmask pattern comprises forming a reversible hardmask layer over the first area by atomic layer deposition (ALD), and wherein
- the reversible hardmask layer comprises an oxide.

6. The method of claim 5, wherein a thickness of the reversible hardmask pattern is about 30 Å to about 300 Å.

7. The method of claim 1, wherein a first pattern density in the first area is greater than a second pattern density in the second area.

8. The method of claim 1, wherein the plurality of hardmask layers further comprise a lower hardmask layer and a main hardmask layer arranged between the etch target layer and the upper hardmask layer, and
- the lower hardmask layer and the main hardmask layer comprise different materials, where the lower hardmask layer is selected from the group consisting of polysilicon, silicon oxide, silicon nitride, and amorphous carbon.

9. A method of forming a pattern, the method comprising:

forming an etch target layer over a substrate including a first area and a second area;

forming a hardmask structure comprising a plurality of hardmask layers, over the etch target layer;

forming a first photoresist pattern that is an engraved pattern having a planar shape reverse to a planar shape of a first pattern to be formed in the first area, over the hardmask structure in the first area, and forming a second photoresist pattern that is an embossed pattern having a planar shape the same as a planar shape of a second pattern to be formed in the second area, over the hardmask structure in the second area;

forming a gap-fill hardmask layer over the first area and the second area;

removing the gap-fill hardmask layer from the first area while maintaining the gap-fill hardmask layer in the second area;

forming a reversible hardmask layer over the first area and the second area;

removing the reversible hardmask layer from the second area to form a reversible hardmask pattern in the first area; and forming the first pattern and the second pattern from the etch target layer by etching the hardmask structure and the etch target layer using respective hardmask patterns in the first area and the second area, wherein the first pattern comprises a plurality of island patterns and a dam structure planarly surrounding the plurality of island patterns.

10. The method of claim 9, wherein the dam structure surrounds the first area and has a vertex with a curvature.

11. The method of claim 9, wherein each of an outer surface and an inner surface of the dam structure has an even shape.

12. The method of claim 9, wherein an outer surface of the dam structure has an even shape, and an inner surface of the dam structure has an uneven shape.

13. The method of claim 9, wherein the plurality of island patterns each have an upper surface with a circular disc shape and are formed in a honeycomb shape in a horizontal direction.

14. The method of claim 9, wherein each of an upper surface and a lower surface of the dam structure is at a same vertical level as an upper surface and a lower surface of the plurality of island patterns.

15. The method of claim 9, wherein a distance from the dam structure to the second pattern closest to the dam structure is about 100 nm to about 300 nm.

16. A method of manufacturing a semiconductor memory device, the method comprising:

forming an etch target layer over a substrate including a memory cell array and a peripheral circuit area;

forming a hardmask structure comprising a plurality of hardmask layers over the etch target layer;

forming a photoresist layer over the hardmask structure;

forming a first photoresist pattern comprising an engraved pattern in the memory cell array, and in which a plurality of holes spaced apart from each other are formed, and a second photoresist pattern comprising an embossed pattern in the peripheral circuit area, and having a shape of a plurality of lines;

forming an upper hardmask pattern including a plurality of openings in the memory cell array and the peripheral circuit area;

forming a gap-fill hardmask layer over the memory cell array and the peripheral circuit area;

removing the gap-fill hardmask layer from the memory cell array while maintaining the gap-fill hardmask layer in the peripheral circuit area;

forming a reversible hardmask layer over the memory cell array and the peripheral circuit area;

removing the reversible hardmask layer from the peripheral circuit area to form a reversible hardmask pattern in the memory cell array; and forming a plurality of island patterns and a dam structure from the etch target layer in the memory cell array by transferring a shape of the reversible hardmask pattern to the etch target layer, and forming a plurality of line patterns from the etch target layer in the peripheral circuit area by transferring a shape of the upper hardmask pattern to the etch target layer.

17. The method of claim 16, wherein the dam structure extends along a side of the memory cell array, surrounds the plurality of island patterns, has a tetragonal ring shape, and has a vertex with a curvature.

18. The method of claim 16, wherein the reversible hardmask pattern is formed over the memory cell array and the peripheral circuit area by atomic layer deposition (ALD), and the reversible hardmask layer comprises an oxide.

19. The method of claim 16, further comprising:

forming a gap-fill hardmask pattern filling the plurality of openings of the memory cell array and the peripheral circuit area; and removing a gap-fill hardmask pattern in the memory cell array.

20. The method of claim 16, wherein an upper surface of each of the plurality of island patterns and the dam structure is at a different vertical level than an upper surface of each of the plurality of line patterns.

* * * * *